US011736110B2

(12) United States Patent
Palla et al.

(10) Patent No.: US 11,736,110 B2
(45) Date of Patent: Aug. 22, 2023

(54) TIME-TO-DIGITAL CONVERTER (TDC) TO OPERATE WITH INPUT CLOCK SIGNALS WITH JITTER

(71) Applicant: Shaoxing Yuanfang Semiconductor Co., Ltd., Shaoxin (CN)

(72) Inventors: Nandakishore Palla, Bangalore (IN); Girisha Angadi Basavaraja, Bangalore (IN); Debasish Behera, Bangalore (IN); Raja Prabhu J, Bangalore (IN); Manikanta Sakalabhaktula, Bangalore (IN); Chandrashekar B G, Bangalore (IN)

(73) Assignee: Shaoxing Yuanfang Semiconductor Co., Ltd., Zhejiang (CN)

( * ) Notice: Subject to any disclaimer, the term of this patent is extended or adjusted under 35 U.S.C. 154(b) by 0 days.

(21) Appl. No.: 17/662,669

(22) Filed: May 10, 2022

(65) Prior Publication Data

US 2023/0108841 A1 Apr. 6, 2023

(30) Foreign Application Priority Data

Sep. 30, 2021 (IN) ............................ 202141044473

(51) Int. Cl.
*H03L 7/085* (2006.01)
*G04F 10/00* (2006.01)
*H03L 7/081* (2006.01)

(52) U.S. Cl.
CPC ............ *H03L 7/085* (2013.01); *G04F 10/005* (2013.01); *H03L 7/081* (2013.01)

(58) Field of Classification Search
CPC ........ H03L 7/085; H03L 7/081; G04F 10/005
See application file for complete search history.

(56) References Cited

U.S. PATENT DOCUMENTS 7,071,751 B1 7/2006 Kaviani
9,092,013 B2 7/2015 Song et al.
(Continued)

FOREIGN PATENT DOCUMENTS

EP 4099052 A1 * 12/2022 .......... G04F 10/005
WO WO-2021185430 A1 * 9/2021
(Continued)

OTHER PUBLICATIONS

M. Skandar Basrour et al., "Time-to-Digital Conversion based on a Self-Timed Ring Oscillator" Nov. 20, 2019, 145 pages.
(Continued)

*Primary Examiner* — Adam D Houston
(74) *Attorney, Agent, or Firm* — IPHorizons PLLC; Narendra Reddy Thappeta

(57) ABSTRACT

A time-to-digital converter (TDC) provided according to an aspect of the present disclosure identifies existence of jitter in either one of two periodic signals received as inputs. In an embodiment, jitter is detected by examining a first sequence of counts and a second sequence of counts respectively for a first periodic signal and a second periodic signal received as input signals, with the first sequence of counts representing respective time instances on a time scale at which a first sequence of edges with a first direction of the first periodic signal occur, and the second sequence of counts representing
(Continued)

respective time instances on the time scale at which a second sequence of edges with the first direction of the second periodic signal occur.

20 Claims, 15 Drawing Sheets

(56) References Cited

U.S. PATENT DOCUMENTS

| | | | | |
|---|---|---|---|---|
| 9,405,024 | B2 | 8/2016 | Frach et al. | |
| 10,496,041 | B2 | 12/2019 | Yao et al. | |
| 10,505,554 | B2 * | 12/2019 | Janardhanan | H03L 7/091 |
| 10,567,154 | B1 * | 2/2020 | Wentzloff | H03L 7/0995 |
| 10,671,025 | B2 | 6/2020 | Mautner et al. | |
| 10,819,355 | B1 * | 10/2020 | Abughazaleh | H03L 7/0992 |
| 10,868,541 | B1 | 12/2020 | Choi et al. | |
| 11,067,954 | B1 * | 7/2021 | Bhaumik | H03L 7/085 |
| 11,079,723 | B2 * | 8/2021 | Chu | H03K 21/38 |
| 11,320,792 | B2 * | 5/2022 | Sudo | G04F 10/005 |
| 11,387,834 | B1 * | 7/2022 | Kumar | H03L 7/1803 |
| 11,592,786 | B1 * | 2/2023 | Behera | H03L 7/0992 |
| 2004/0161068 | A1 * | 8/2004 | Zerbe | H04L 7/033 375/355 |
| 2008/0069292 | A1 | 3/2008 | Straayer et al. | |
| 2009/0296532 | A1 * | 12/2009 | Hsieh | G04F 10/005 368/120 |
| 2010/0023289 | A1 * | 1/2010 | Miyazaki | G01R 29/023 702/69 |
| 2010/0134083 | A1 * | 6/2010 | Trescases | H03M 1/1014 323/283 |
| 2010/0327912 | A1 * | 12/2010 | Chiu | H03L 7/0802 327/159 |
| 2016/0371363 | A1 * | 12/2016 | Muro | G06Q 10/10 |
| 2020/0028662 | A1 * | 1/2020 | Brown | H03L 7/18 |
| 2022/0026856 | A1 * | 1/2022 | Lee | H03L 7/085 |
| 2022/0278690 | A1 * | 9/2022 | Shumaker | H03L 7/24 |
| 2023/0108841 | A1 * | 4/2023 | Palla | H03L 7/085 327/156 |

FOREIGN PATENT DOCUMENTS

| | | | | |
|---|---|---|---|---|
| WO | WO-2021254606 | A1 | * | 12/2021 |
| WO | WO-2022128049 | A1 | * | 6/2022 |

OTHER PUBLICATIONS

"Variable Modulus Counter" http://www.elektronikjk.pl/elementy_czynne/IC/9305.pdf, downloaded circa Jan. 10, 2022, 04 Pages.

Wu Gao et al., "Integrated High-Resolution Multi-Channel Time-to-Digital Converters (TDCs) for PET Imaging", http://citeseerx.ist.psu.edu/viewdoc/download?doi=10.1.1.688.658&rep=rep1&type=pdf, Jan. 8, 2011, 23 Pages.

Kuo-Hsing Cheng et al., "A time-to-digital converter using multi-phase-sampling and time amplifier for all digital phase-locked loop," 13th IEEE Symposium on Design and Diagnostics of Electronic Circuits and Systems, Date of Conference: Apr. 14-16, 2010, 05 Pages.

Scott Tancock et al., "A Review of New Time-to-Digital Conversion Techniques," in IEEE Transactions on Instrumentation and Measurement, vol. 68, No. 10, pp. 3406-3417, Oct. 2019.

Kyu-Dong Hwang et al., "An area efficient asynchronous gated ring oscillator TDC with minimum GRO stages," Proceedings of 2010 IEEE International Symposium on Circuits and Systems, Date of Conference: May 30, 2010-Jun. 2, 2010, pp. 3973-3976.

"TDC7201 Time-to-Digital Converter for Time-of-Flight Applications in LIDAR, Range Finders, and ADAS" SNAS686—May 2016 DOI: https://www.ti.com/lit/ds/symlink/tdc7201.pdf?ts=1641356653664&ref_url=https%253A%252F%252Fwww.google.com%252F, May 2016, 50 Pages.

"Time-to-Digital Converter with Analog Front-End" MAX35101 DOI: https://datasheets.maximintegrated.com/en/ds/MAX35101.pdf, Downloaded circa Jan. 10, 2022, 66 Pages.

J. Christiansen, "High Performance Time to Digital Converter" Version 2.2, https://cds.cern.ch/record/1067476/files/cer-002723234.pdf, Mar. 2004, 102 Pages.

"MTD135 8-Channel, Multi-hit Time-to-Digital Converter", https://teledynelecroy.com/lrs/dsheets/mtd.htm, downloaded circa Jan. 7, 2022, 10 Pages.

"TDC-GP1 General Purpose TDC" General Purpose TDC, Feb. 12, 2001, acam mess electronic, https://www.pmt-fl.com/uploads/2017/09/precision-measurement-db-gp1-en-1019306.pdf, Feb. 12, 2001, 61 Pages.

QuTAG, https://www.qutools.com/wp-content/uploads/2019/02/quTAG_Datasheet.pdf, Downloaded circa Jan. 7, 2022, 04 Pages.

* cited by examiner

TIME-TO-DIGITAL CONVERTER (TDC) TO OPERATE WITH INPUT CLOCK SIGNALS WITH JITTER

PRIORITY CLAIM

The instant patent application is related to and claims priority from the co-pending India provisional patent application entitled, "Time-to-Digital Converter (TDC) Architecture for Measuring Phase Differences Among Multiple Clocks", Serial No.: 202141044473, Filed: 30 Sep. 2021, which is incorporated in its entirety herewith to the extent not inconsistent with the description herein.

RELATED APPLICATIONS

The instant application is related to co-pending U.S. patent application Ser. No.: 17/662,662, Entitled, "Counter Design for a Time-To-Digital Converter (TDC)", inventors Debasish Behera, et al, Filed: May 10, 2022; Attorney Docket No: AURA-021-US, which is incorporated in its entirety herewith.

The instant application is related to co-pending U.S. patent application Ser. No: 17/662,667, Entitled, "Time-to-digital Converter (TDC) Measuring Phase Difference Between Periodic Inputs", inventors Debasish Behera, et al, Filed: May 10, 2022, now granted as U.S. Pat. No. 11,592,786, issued Feb. 28, 2023; Attorney Docket No: AURA-031-US, which is incorporated in its entirety herewith.

BACKGROUND

Technical Field

Embodiments of the present disclosure relate generally to time-to-digital converters (TDCs), and more specifically to TDC operating with input clock signals with jitter.

Related Art

TDCs are generally used to measure a time interval between a pair of events. The measurement is commonly quantified as a corresponding digital value. The events are typically voltage or logic-level changes of a corresponding pair of signals. TDCs find applications in electronic devices such as phase locked loops (PLL), timing cards, ToF (time-of-flight) measuring devices such as in radiation detectors, diagnostic equipment, etc.

TDCs often receive periodic input signals and generate successive digital values representing the phase difference at corresponding time instances. Each digital value represents the time difference between corresponding edges (of the same direction) of the two periodic inputs. Examples of periodic signals include clocks, etc.

Jitter is often presented with clock signals provided as inputs to TDCs. Jitter refers to additional noise component introduced into the clock signal manifesting as deviations from expected/nominal periodicity. Jitter is introduced due to reasons such as switching noise, cross-talk, thermal noise, etc., as is well known in the relevant arts.

Aspects of the present disclosure are directed to TDCs adapted to operate with clock signals with jitter.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1:
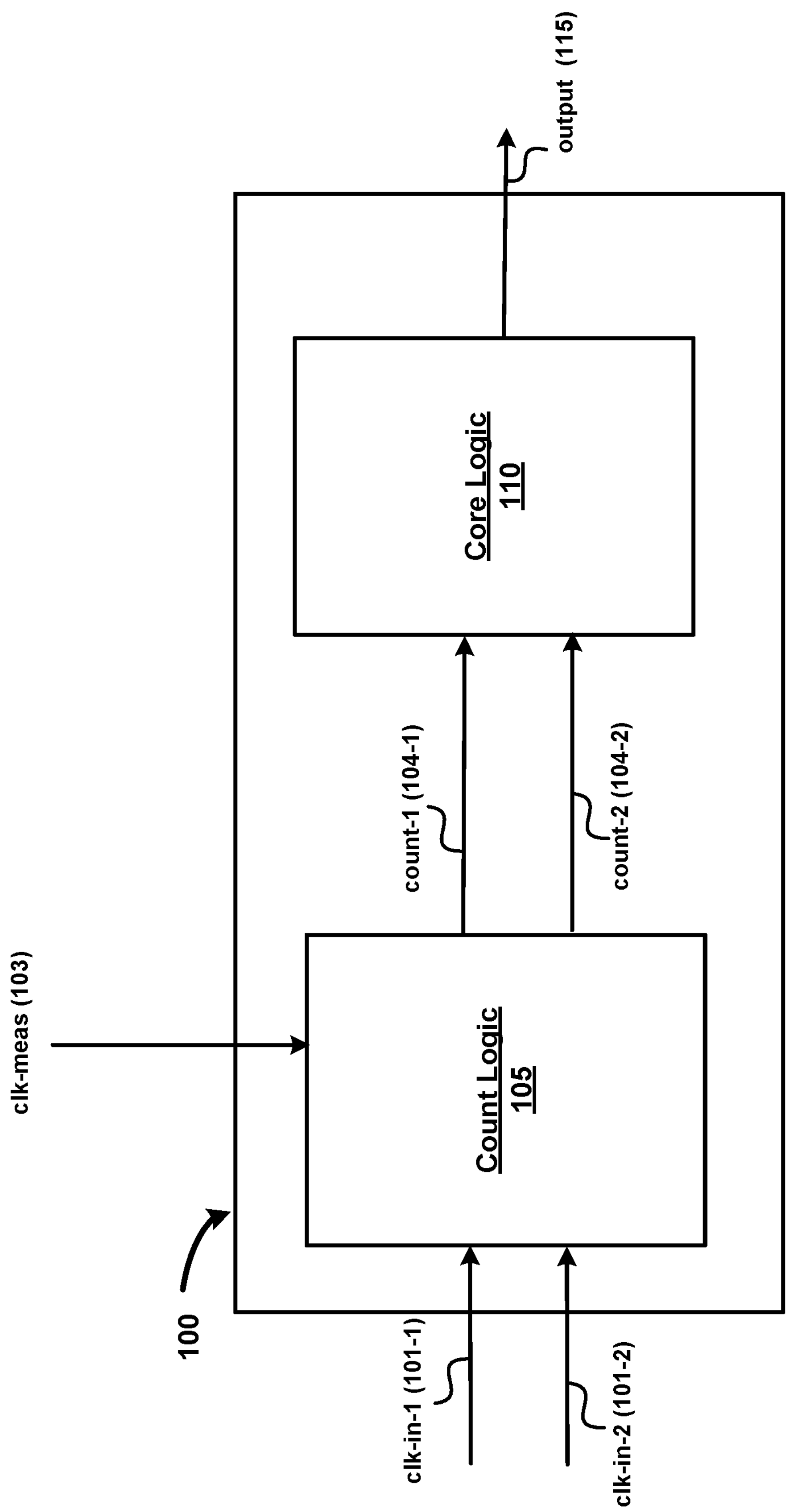
FIG. 1 is a block diagram of an example device in which several aspects of the present disclosure can be implemented.

A time-to-digital converter (TDC) provided according to an aspect of the present disclosure identifies existence of jitter in either one of two periodic signals received as inputs. In an embodiment, jitter is detected by examining a first sequence of counts and a second sequence of counts respectively for a first periodic signal and a second periodic signal received as input signals, with the first sequence of counts representing respective time instances on a time scale at which a first sequence of edges with a first direction of the first periodic signal occur, and the second sequence of counts representing respective time instances on the time scale at which a second sequence of edges with the first direction of the second periodic signal occur.

According to another aspect of the present disclosure, a TDC generates phase differences according to a first approach when jitter is not present and according to a second approach when jitter is present. In one embodiment, the first approach entails computing phase differences by aggregating positive time differences and negative time differences in separate accumulators, while the second approach computes phase differences by aggregating both of positive time differences and negative time differences into a single accumulator. Thus, the TDC advantageously generates phase differences disregarding at least some of the noise introduced by jitter, when jitter is identified to be present.

According to one more aspect of the present disclosure, the TDC is also operable when both the periodic signals have the same frequency or when one of the periodic signals has a frequency that is an integer multiple of frequency of the other periodic signal.

A core logic of the TDC processing the first sequence of counts and second sequence of counts in an embodiment may contain an input analyzer and an output generator. The input analyzer block generates a sequence of window boundaries from the first sequence of counts. The output generator generates a value indicating the corresponding phase difference for each clock period of the slower one of the two periodic signals.

The output generator in an embodiment includes a subtraction unit to generate the sequence of time differences, a positive-minimum-generator to select a positive-minimum value representing the least value of positive values comprised in the sequence of time differences, a negative-maximum-generator to select a negative-maximum value representing the maximum value of negative values comprised in the sequence of time differences, a first accumulator to receive a sequence of the positive-minimum values covering corresponding windows and to add values in the sequence of the positive-minimum values to generate a first accumulated value, a second accumulator to receive a sequence of the negative-minimum values covering the corresponding windows, and to add values in the sequence of the negative-minimum values to generate a second accumulated value, and a jitter-detector-block to receive the first accumulated value and the second accumulated value, and to generate a jitter-present signal indicating whether or not the jitter is present, wherein the jitter-detector-block determines that the jitter is present if both of the first accumulator and the second accumulator have exceeded respective thresholds.

The TDC may also include an accumulator output block to receive the first accumulated value and the second accumulated value, and to generate a minimum of magnitudes of the first accumulated value and the second accumulated value as an accumulate phase difference up to the corresponding window when jitter is determined not to be present.

When the jitter is determined to be present, one of the two accumulators is reset to a boundary value (e.g., 0), and the resetted accumulator thereafter accumulates one of the positive minimum value and the negative maximum value having lower magnitude in each window, wherein the accumulator output block forwards the accumulated value in the resetted accumulator as the accumulated phase difference.

Several aspects of the present disclosure are described below with reference to examples for illustration. However, one skilled in the relevant art will recognize that the disclosure can be practiced without one or more of the specific details or with other methods, components, materials and so forth. In other instances, well known structures, materials, or operations are not shown in detail to avoid obscuring the features of the disclosure. Furthermore, the features/aspects described can be practiced in various combinations, though only some of the combinations are described herein for conciseness.

2. Example Device

FIG. 1 is a block diagram of a time-to-digital converter (TDC) implemented according to several aspects of the present disclosure, in an embodiment. TDC 100 is shown containing count logic 105 and core logic 110. TDC 100 is shown connected to receive input clocks clk-in-1 (101-1) and clk-in-2 (101-2), and a measurement clock clk-meas (103). Input clocks clk-in-1 (101-1) and clk-in-2 (101-2) represent the periodic inputs for which a phase difference is sought to be measured (determined) using TDC 100. 'Phase difference' refers to the difference in phase angle between two periodic signals.

Path 115 provided according to an aspect of the present disclosure provide values representing the (accumulated) phase difference at corresponding time instances.

Count logic 105 internally contains counters for each of input clocks clk-in-1 (101-1) and clk-in-2 (101-2). Count logic 105 is connected to receive input clocks clk-in-1 (101-1) and clk-in-2 (101-2). Clk-meas (103) represents a measurement clock applied to the counters in count logic 105. In an embodiment, each of the counters is designed to increment by one count at each cycle (e.g., at each rising edge) of clk-meas (103). However, in alternative embodiments, other conventions for counting, such as decrementing the counters by 1 or some other fixed value for each clock cycle of clk-meas (103), may be employed, as will be apparent to a skilled practitioner. The frequency of clk-meas (103) at least partially or substantially determines the resolution with which the time difference between two events (such as, for example, rising edges of the input clocks) can be generated.

Count logic 105 is shown as generating count-1 (104-1) and count-2 (104-2) respectively for input clocks clk-in-1 (101-1) and clk-in-2 (101-2). Each sequence of counts in count-1 (104-1) and count-2 (104-2) represents respective time instances on a same time scale at which edges of a pre-specified direction (rising or falling) of corresponding input clocks occur. The term 'same time scale' implies that each count represents a respective relative time duration from a common start time. For example, counters for each input clock start counting (e.g., from zero) at the same time (e.g., upon reset) and with identical frequency. Count logic 105 can be implemented in a known way. In an embodiment of the present disclosure, counts generated by counters in count logic 105 are 36-bits wide, and the time resolution of the counters is 62.5 pico-seconds (ps).

In an embodiment, count logic 105 is implemented as described in U.S. application Ser. No. 17/662,662, filed: May 10, 2022, entitled "Counter Design for a Time-To-Digital Converter (TDC)", and assigned to the assignee of the present application, the contents of which are incorporated herein by reference in its entirety.

Core logic 110 is connected to receive count-1 (104-1) and count-2 (104-2), and generates output digital values on path 115, as briefly described above.

Several features of the present disclosure may be better appreciated when the manner in which periodic inputs may exhibit jitter is understood. Accordingly, the manner in which an input clock exhibits jitter is briefly described next with respect to FIG. 2.

3. Periodic Inputs with Jitter

Figure 2:
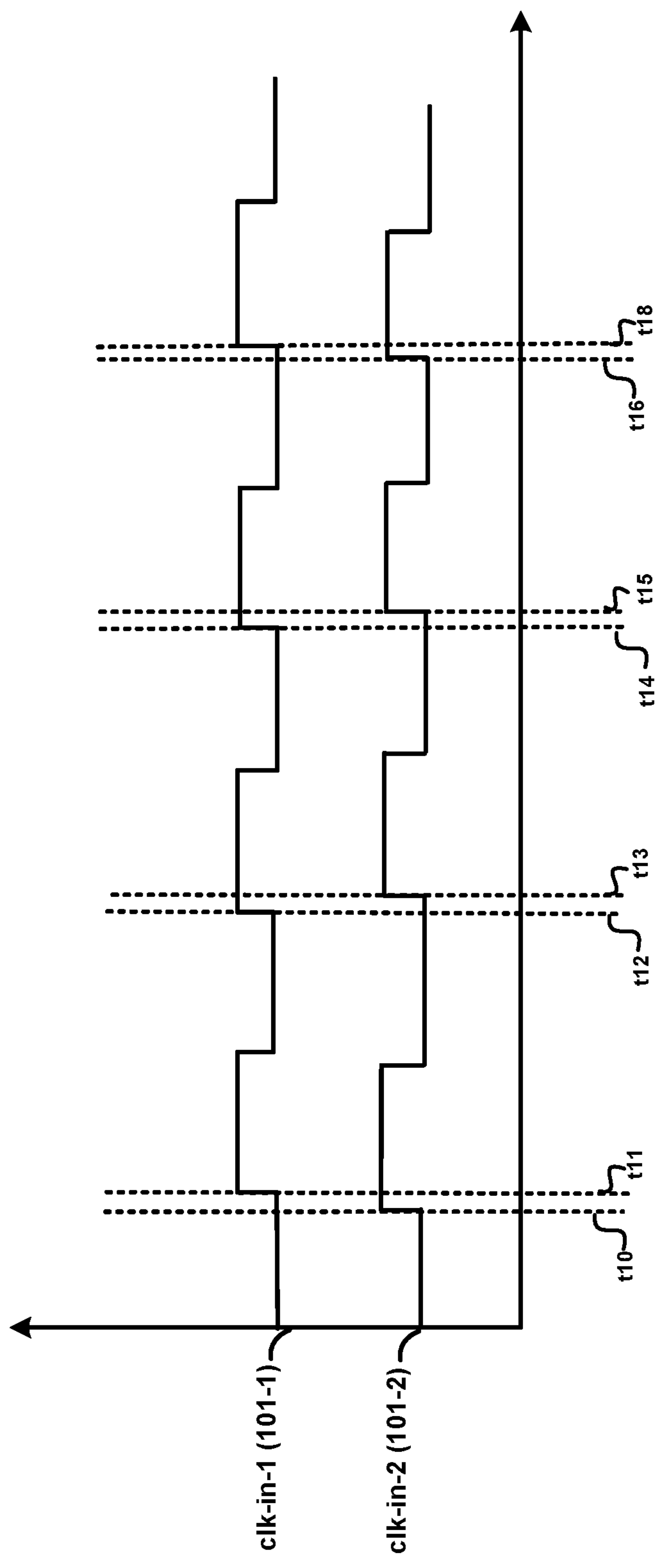
FIG. 2 is a timing diagram illustrating jitter in a pair of input clocks in an embodiment.

FIG. 2 is a timing diagram illustrating the manner in which one of a pair of periodic inputs having the same frequency and same phase in steady state, has jitter in an embodiment. In FIG. 2, the waveform depicting the jitter is not to scale, and is provided merely to illustrate jitter. In FIG. 2, waveforms 101-1 and 101-2 respectively represent the input clocks (clk-in-1 and clk-in-2) for which phase difference is sought to be measured.

The rising edges of clk-in-1 (101-1) are shown to be occurring at time instants t11, t12, t14 and t18, while the rising edges of clk-in-2 (101-2) are shown to be occurring at time instants t10, t13, t15 and t16. In steady state, in the absence of jitter in the input clocks, each rising edge of clk-in-2 (101-2) would have coincided with a respective rising edge of clk-in-1 (101-1), i.e., rising edges of clk-in-2 (101-2) would also have occurred at time instants t11, t12, t14 and t18.

However, as depicted in FIG. 2, the rising edges of clk-in-2 (101-2) are shown to be occurring either slightly ahead of corresponding rising edges of clk-in-1 (101-1), such as at time instants t10 and t16 in some cycles, or slightly later than corresponding rising edges of clk-in-1 (101-2), such as at time instants t13 and t15 in some cycles.

Thus, clk-in-2 (101-2) is said to be having 'jitter'. In general, jitter exhibits random characteristic and thus manifests as negative and positive time differences when superimposed on an otherwise ideal clock signal. Aspects of the present disclosure take advantage of such an observation to identify jitter.

Further aspects of the present disclosure seek to reduce the undesirable impact on the measured phase differences by disregarding time differences of positive or negative sign in computation of phase differences when jitter is identified to be present.

The timing diagram of FIG. 2 depicts a simplistic illustration of jitter for the ease of understanding. However, in practice, jitter would be more random, and there may be several cycles of input clock with jitter. Further, as would be apparent to a skilled practitioner, jitter may be of several types such as random jitter, deterministic jitter, etc. Aspects of the present disclosure are applicable to such types of jitter as well.

Although the timing diagram of FIG. 2 illustrates jitter in a pair of periodic inputs (input clocks) having the same frequency, aspects of the present disclosure are applicable to a pair of input clocks whose frequencies are integer-related multiples greater than 1.

TDC 100 implemented according to aspects of the present disclosure detects the presence of jitter in one of the input clocks, in addition to providing phase differences both in the presence and absence of jitter, as described below with examples.

4. Flowchart

Figure 3A:
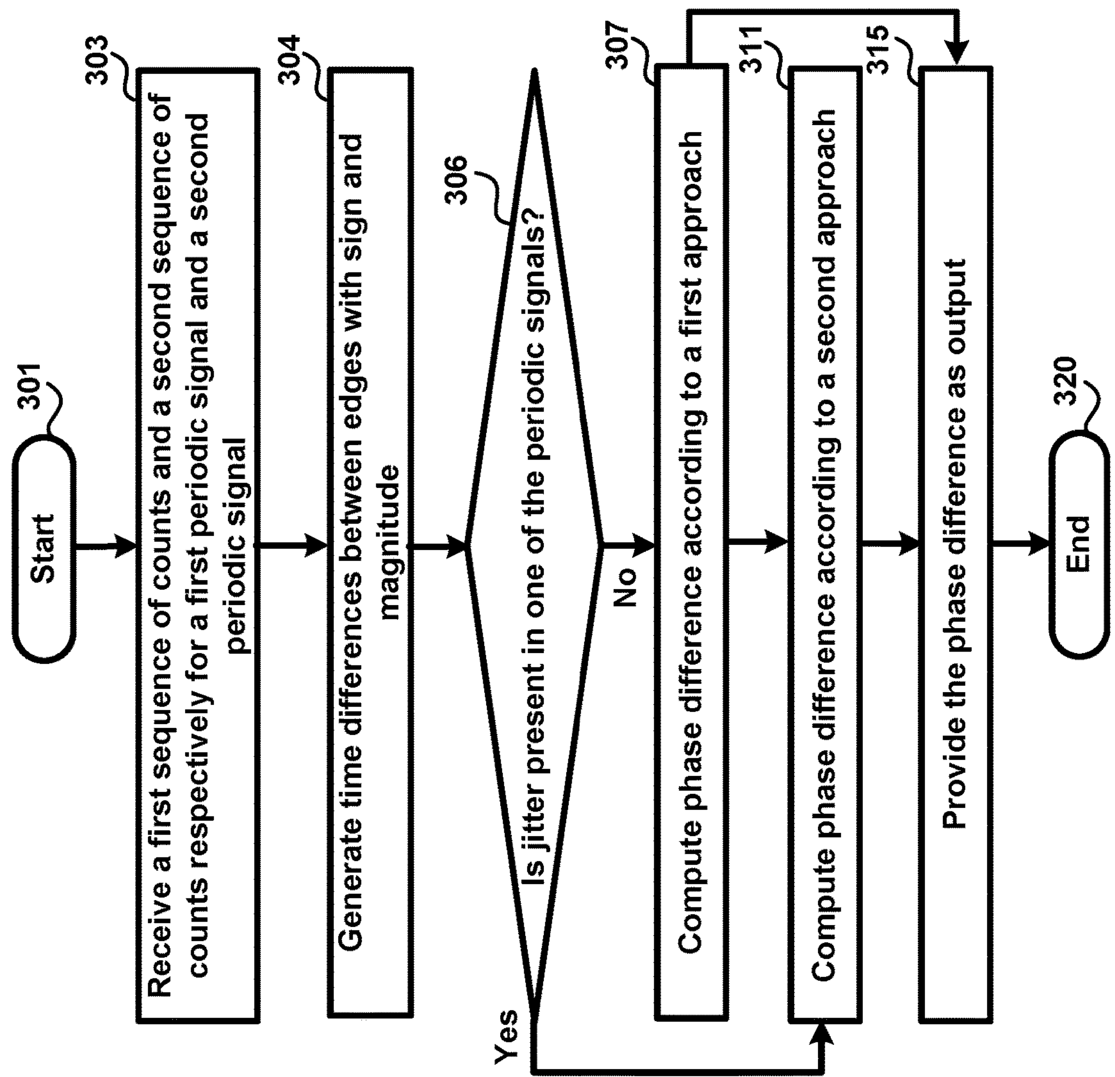
FIG. 3A is a flowchart illustrating the manner in which a time-to-digital converter (TDC) operates with input clock signals with jitter, according to an aspect of the present disclosure

FIG. 3A is a flowchart illustrating the manner in which a TDC operates with input clock signals with jitter, according to an aspect of the present disclosure. The flowchart is described with respect to the core logic 110 of FIG. 1 merely for illustration. However, many of the features can be implemented in other systems and/or other environments also without departing from the scope and spirit of several aspects of the present disclosure, as will be apparent to one skilled in the relevant arts by reading the disclosure provided herein.

In addition, some of the steps may be performed in a different sequence than that depicted below, as suited to the specific environment, as will be apparent to one skilled in the relevant arts. Many of such implementations are contemplated to be covered by several aspects of the present disclosure. The flowchart begins in step 301, in which control immediately passes to step 210.

In step 303, core logic 110 receives a first sequence of counts and a second sequence of counts respectively for a first periodic signal and a second periodic signal. In step 304, core logic 104 generates time differences between edges (of the same direction) of the two periodic signals, with each time difference represented with sign and magnitude.

In step 306, core logic 110 checks whether jitter is present in one of the periodic signals. Control transfers to step 307 if there is no jitter, and to step 311 if there is jitter. Steps 307 and 311 compute phase difference according to different approaches, specifically for countering the effects of jitter on accurate phase difference measurements.

Any suitable approach may be chosen to minimize the impact of jitter on phase difference measurement when jitter is detected. In an embodiment described below, the first approach entails computing phase differences by aggregating positive time differences and negative time differences in separate accumulators, while the second approach computes phase differences by aggregating both of positive time differences and negative time differences into a single accumulator.

Control then transfers to step 315, in which the computed phase difference is provided to any external components requiring such information. The flowchart ends in step 320.

Thus, TDC of the present disclosure provides phase differences of reasonably accuracy even when jitter is present in one of the clock signals. The implementation details of core logic contained in such a TDC in an embodiment of the present disclosure are briefly provided next.

5. Core Logic

Figure 3B:
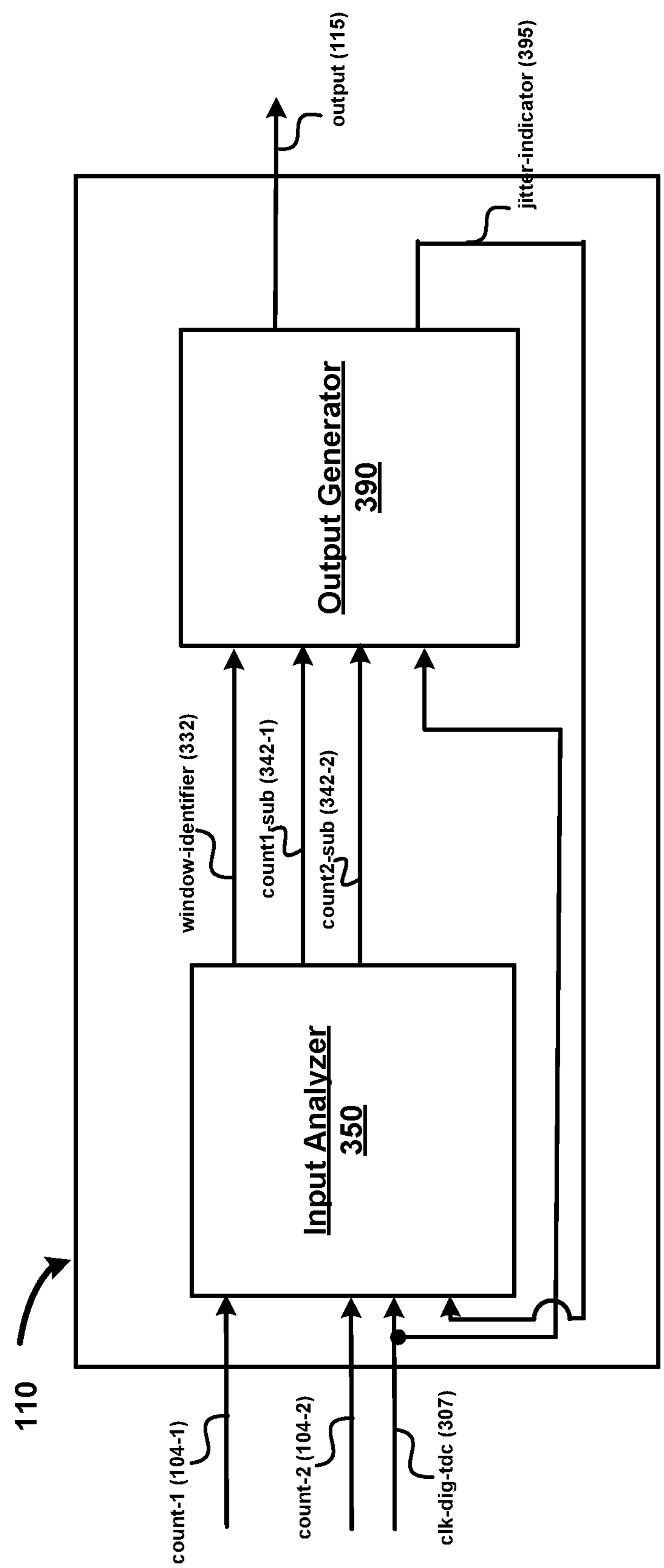
FIG. 3B is a block diagram of a core logic implemented in an embodiment of the present disclosure.

FIG. 3B is a block diagram illustrating the implementation details of core logic 110 in an embodiment of the present disclosure. Core logic 110 is shown containing input analyzer block 350 and output generator block 390.

Input analyzer block 350 is shown as receiving inputs count-1 on path 104-1, count-2 on path 104-2, clk-dig-tdc on path 307 and jitter-indicator signal on path 395. Input analyzer block 350 generates signals window-identifier on path 332, count1-sub on path 342-1 and count2-sub on path 342-2. Input analyzer block 350 receives count-1 (104-1) and count-2 (104-2) at every rising edge of the corresponding input clock (101). Input analyzer block 350 may store count-1 (104-1) and count-2 (104-2) values, and additionally perform operations such as handling rollover of counters generating count-1 (104-1) and count-2 (104-2). In the absence of such additional operations, count1-sub (104-1) and count2-sub (104-2) are functionally equivalent to count-1 (104-1) and count-2 (104-2) respectively.

Input analyzer block 350, among other operations, operates to determine the boundaries of windows (respective time instances) corresponding to (or defined by) a pair of successive edges of either one of the two input clocks clk-in-1 (101-1) and clk-in-2 (101-2) when both clocks have the same frequency, and of the slower clock when the clocks have frequencies that are integer multiples greater than 1. Input analyzer 350 indicates the boundaries (the left and right edges) of a window using signal window-identifier (332), as will be described in detail below.

Although the description is continued with respect to rising edges of input clocks, aspects of the present disclosure are equally applicable to falling edges of input clocks, as will be apparent to a skilled practitioner by reading the disclosure herein.

Output generator block 390 is shown as receiving window-identifier on path 332, count1-sub on path 342-1, count2-sub on path 342-2 and clk-dig-tdc on path 307, and generates signal jitter-indicator on path 395. In an embodiment, output generator block 390 generates one value of a sequence of values in each window of a sequence of windows on path 115, wherein the value indicates the corresponding computed phase difference for the window. Additional outputs may be provided on corresponding paths based on a mode of operation of TDC 100, as will be described in detail below.

Although TDC 100 noted above is shown as operating on only a pair of periodic inputs, TDC 100 can be implemented to operate simultaneously on more than a pair of periodic inputs with suitable modifications to TDC 100. The operation of a TDC with more than a pair of periodic inputs is described in detail in U.S. application Ser. No. 17/662,667, filed: May 10, 2022, now granted as U.S. Pat. No. 11,592,786, issued Feb. 28, 2023, entitled "Time-to-digital Converter (TDC) Measuring Phase Difference Between Periodic Inputs", and assigned to the assignee of the present application, the contents of which are incorporated herein by reference in its entirety.

The details of the operations performed by input analyzer block 350 and output generator block 390 of core logic 110 in determining the phase difference between a pair of input clocks are described in detail next.

6. Input Analyzer Block

Figure 4A:
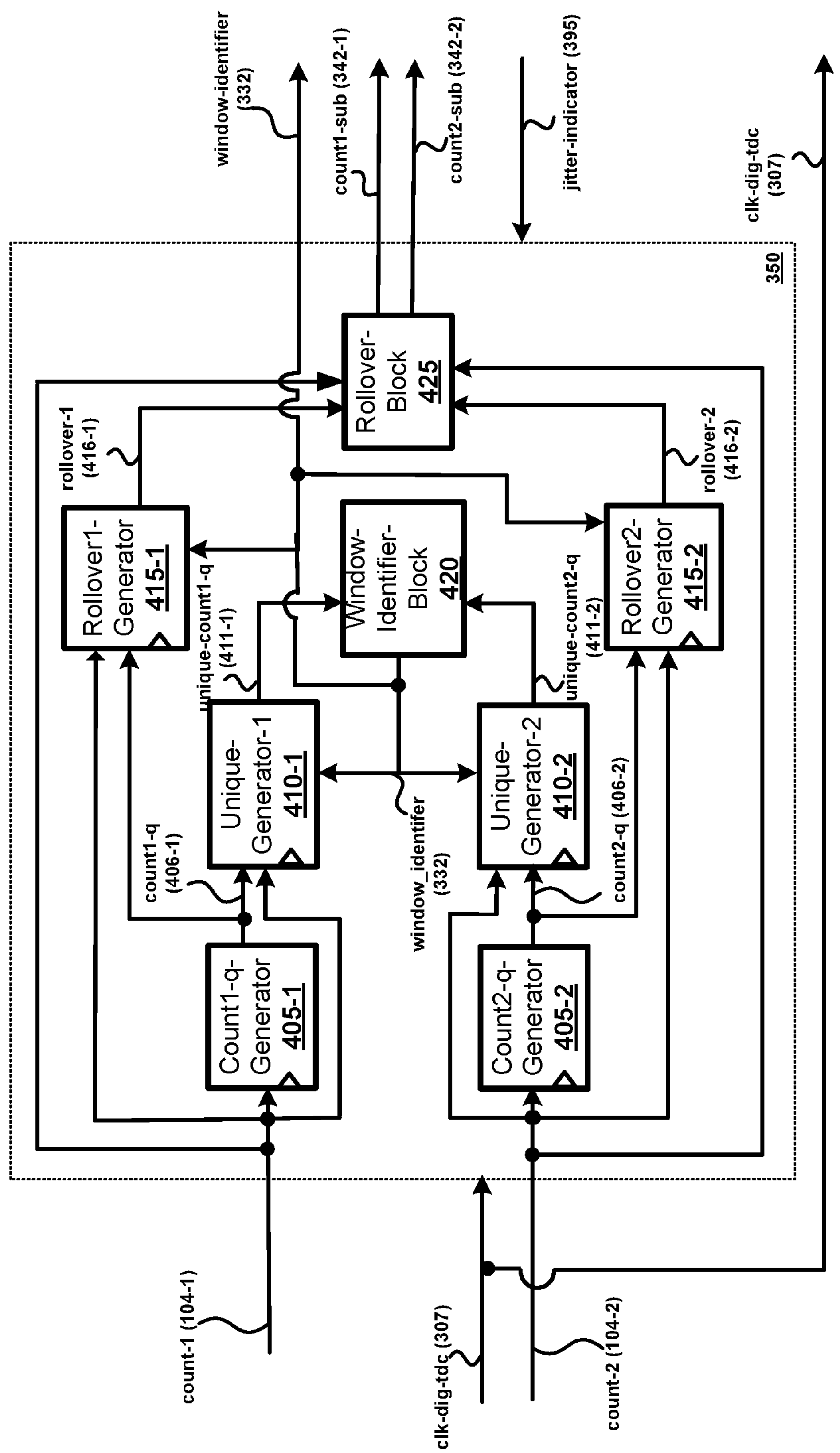
FIG. 4A is a block diagram of an input analyzer block implemented in an embodiment of the present disclosure.

FIG. 4A is a block diagram illustrating the implementation details of an input analyzer block in an embodiment of the present disclosure. Input analyzer block 350 is shown containing count-1-q-generator 405-1, count-2-q-generator 405-2, unique-generator-1 410-1, unique-generator-2 410-2, rollover1-generator 415-1, rollover2-generator 415-2, window-identifier-block 420 and rollover block 425. The specific blocks and interconnections of FIG. 4A are shown merely by way of example. More or fewer blocks can be used in other embodiments of the present disclosure. In an embodiment of the present disclosure, blocks 405-1, 405-2, 410-1, 410-2, 415-1 and 415-2 are implemented using sequential logic, while blocks 420 and rollover block 425 are implemented using combinatorial logic. However, the blocks can be implemented differently as will be apparent to a skilled practitioner by reading the disclosure herein. Sequential blocks of input analyzer block 350 are clocked by clk-dig-tdc (307).

As noted above, the frequency of clk-dig-tdc (307) is greater than the frequency of clk-in-1 (101-1) and clk-in-2 (101-2), and the values of count-1 (104-1) and count-2 (104-2) are received at every rising edge of respective clocks. Thus, the values of count-1 (104-1) and count-2 (104-2) can remain unchanged for two or more cycles of clk-dig-tdc (307). Accordingly, a change in respective values of count-1 (104-1) and count-2 (104-2) may be inspected for determining phase difference between clk-in-1 (101-1) and clk-in-2 (101-2). Blocks count-1-q-generator 405-1, count-2-q-generator 405-2, unique-generator-1 410-1, unique-generator-2 410-2 and window-identifier-block 420 operate to provide such functionality.

Count-1-q-generator 405-1 receives count-1 on path 104-1 and generates count1-q on path 406-1. In an embodiment, count1-q-generator 405-1 is implemented as a positive edge triggered flip-flop. Count1-q-generator 405-1 is clocked by clk-dig-tdc (307). Count-1-q (406-1) represents a time-delayed version of count-1 (104-1). Accordingly, signal count-1 (104-1) is delayed by one clock cycle of clk-dig-tdc (307) before being output on path 406-1.

Count-2-q-generator 405-2 receives count-2 on path 104-2 and generates count2-q on path 406-2. In an embodiment, count2-q-generator 405-2 is implemented as a positive edge triggered flip-flop. Count2-q-generator 405-2 is clocked by clk-dig-tdc (307). Count-2-q (406-2) represents a time-delayed version of count-2 (104-2). Accordingly, signal count-2 (104-2) is delayed by one clock cycle of clk-dig-tdc (307) before being output on path 406-2.

Unique-generator-1 410-1 receives count-1 (104-1), count1-q (406-1) and window-identifier (332), and generates unique-count1-q on path 411-1. As may be observed from FIG. 4A, the operations of unique-generator-1 410-1 and window-identifier-block 420 (described below) depend on the outputs of each other. In general, unique-generator-1 410-1 is a binary signal that indicates whether a new count is available at the boundary of a window identified by window-identifier-block 420. In an embodiment of the present disclosure, unique-generator-1 410-1 is implemented as a sequential block, clocked by clk-dig-tdc (307), and implements the following logic:

Unique-generator-1 410-1 generates a logic LOW on path 411-1 when count-1 (104-1) is equal to count1-q (406-1) and window-identifier (332) is a logic HIGH, and a logic HIGH when count-1 (104-1) is not equal to count1-q (406-1). In other words, unique-generator-1 410-1 operates to determine that the count value of count-1 (104-1) has undergone a change (indicating the occurrence of a rising edge of clk-in-1, 101-1) from its value in a previous clock cycle of clk-dig-tdc (307), and also additionally takes into account the value of window-identifier (332).

Unique-generator-2 410-2 receives count-2 (104-2), count2-q (406-2) and window-identifier (332), and generates unique-count2-q on path 411-2. As may be observed from FIG. 4A, the operations of unique-generator-2 410-2 and window-identifier-block 420 (described below) depend on the outputs of each other. In general, unique-generator-2 410-2 is a binary signal that indicates whether a new count is available at the boundary of a window identified by window-identifier-block 420. In an embodiment of the present disclosure, unique-generator-2 410-2 is implemented as a sequential block, clocked by clk-dig-tdc (307), and implements the following logic:

Unique-generator-2 410-2 generates a logic LOW on path 411-2 when count-2 (104-2) is equal to count2-q (406-2) and window-identifier (332) is a logic HIGH, and a logic HIGH when count-2 (104-2) is not equal to count2-q (406-2). In other words, unique-generator-2 410-2 operates to determine that the count value of count-2 (104-2) has undergone a change (indicating the occurrence of a rising edge of clk-in-2, 101-2) from its value in a previous clock cycle of clk-dig-tdc (307), and additionally takes into account the value of window-identifier (332).

Core logic 110 receives a continuous stream of counts representing corresponding edges of input clocks (clk-in-1, 101-1 and clk-in-2, 101-2). Core logic 110 generates each output of the sequence of outputs (noted above) from a pair of successive edges (of a same direction, rising/falling) of one input clock (e.g., clk-in-1, 101-1) and an individual one of the other input clock (e.g., clk-in-2, 101-2). Core logic 110, therefore, needs to identify a respective pair of successive edges for generating each output. Window-identifier-block 420, implemented in input analyzer block 350, performs such an operation.

Window-identifier-block 420 operates to identify the window boundaries noted above. That is, window-identifier-block 420 operates to identify time instants of occurrence of a pair of successive edges of the same direction (rising or falling) of the slower input clock when the frequencies of the two input clocks are integer multiples greater than one, or a pair of successive edges of the same direction (rising or falling) of either of the two input clocks when the frequencies of the two input clocks are equal. The duration between the time instants is referred to herein as a window. Each window may have a respective stream of differences that need to be examined in order to generate an output (representing the phase difference between input clocks, clk-in-1, 101-1 and clk-in-2, 101-2) upon the end of each window.

Window-identifier-block 420 receives unique-count1-q (411-1) and unique-count2-q (411-2), and generates signal window-identifier on path 332. Window-identifier-block 420 generates a logic HIGH on path 332 when both unique-count1-q (411-1) and unique-count2-q (411-2) are logic HIGH, and a logic LOW otherwise. As will become apparent in the description below, a pair of successive logic HIGHs represents the window boundaries noted above.

Rollover1-generator 415-1 receives count-1 (104-1), count1-q (406-1), window-identifier (332) and generates signal rollover-1 on path 416-1. In an embodiment of the present disclosure, rollover1-generator 415-1 is implemented as a sequential block, clocked by clk-dig-tdc (307). Rollover1-generator 415-1 generates a logic HIGH on path 416-1 when a count value of count-1 (104-1) has exceeded the full-scale value (rolled over) of the counter. As is well known in the relevant arts, a rollover is said to occur when the value of a counter reaches its full-scale value, and the counter starts counting from zero. For example, for a 10-bit counter, a rollover is said to occur when the value of count reaches 1024.

Rollover2-generator 415-2 receives count-2 (104-2), count2-q (406-2), window-identifier (332) and generates signal rollover-2 on path 416-2. In an embodiment of the present disclosure, rollover2-generator 415-2 is implemented as a sequential block, clocked by clk-dig-tdc (307). Rollover2-generator 415-2 generates a logic HIGH on path 416-2 when a count value of count-2 (104-2) has exceeded the full-scale value (rolled over) of the counter.

Rollover block 425 receives count-1 (104-1), count-2 (104-2), rollover-1 (416-1) and rollover-2 (416-2), and generates count1-sub (342-1) and count2-sub (342-2). In an embodiment of the present disclosure, rollover block 425 is implemented as a combinational block. Rollover block 425 operates to ensure that a respective correct value of input counts is forwarded to output generator block 390 in case of a rollover of either input count.

In an embodiment, rollover handling is implemented as described in detail in U.S. application Ser. No. UNASSIGNED, filed: on even date herewith, entitled "Time-to-digital Converter (TDC) Measuring Phase Difference Between Periodic Inputs", and assigned to the assignee of the present application, the contents of which are incorporated herein by reference in its entirety.

The implementation details of output generator block 390 in an embodiment of the present disclosure are provided next.

7. Output Generator Block

Figure 4B:
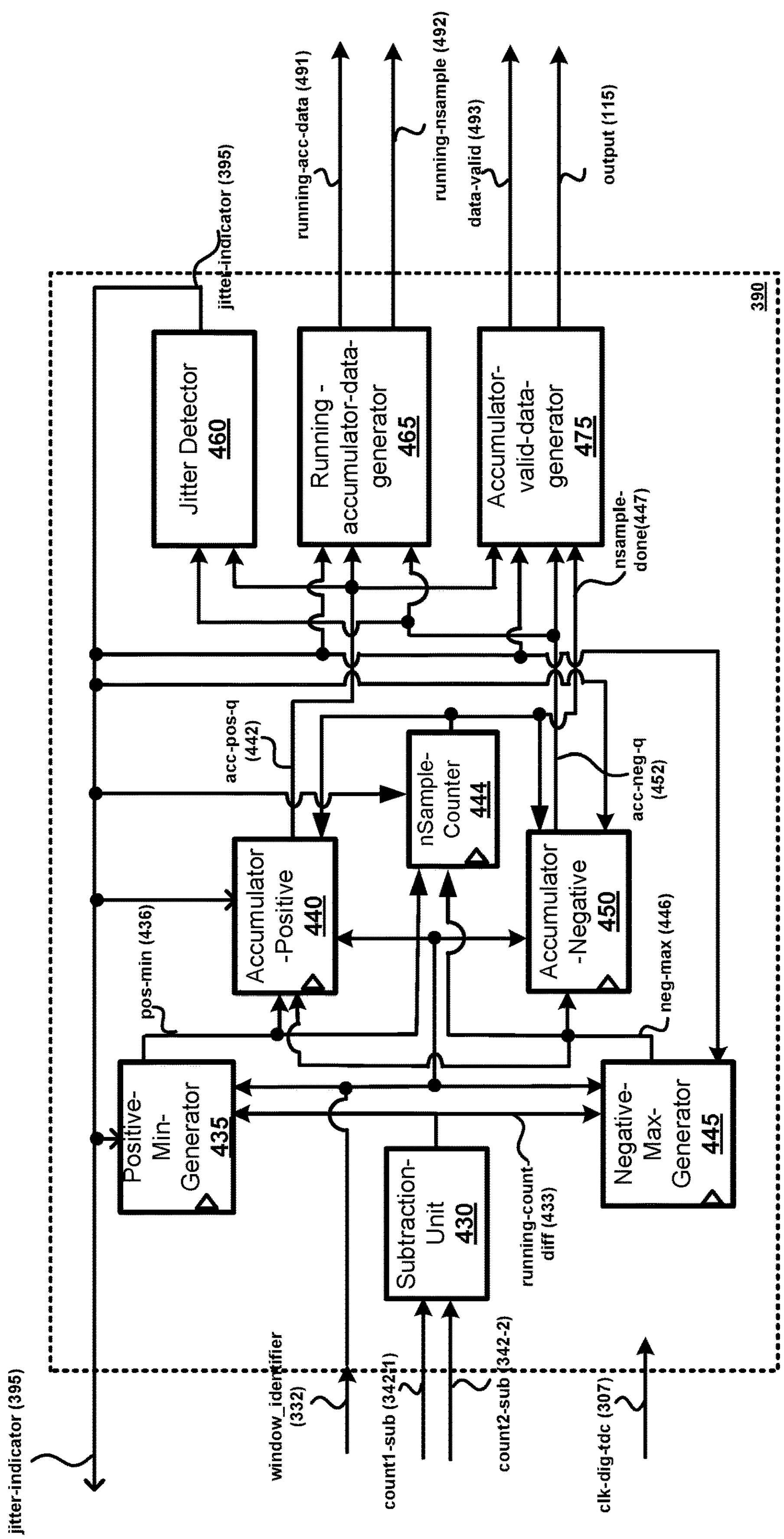
FIG. 4B is a block diagram of an output generator block implemented in an embodiment of the present disclosure.

FIG. 4B is a block diagram illustrating the implementation details of an output generator block in an embodiment of the present disclosure. Output generator block 390 is shown containing subtraction-unit 430, positive-min-generator 435, negative-max-generator 445, nSample-counter 444, accumulator-positive 440, accumulator-negative 450, jitter-detector 460, running-accumulator-data-generator 465 and accumulator-valid-data-generator 475.

The specific blocks and interconnections of FIG. 4B are shown merely by way of example. More or fewer blocks can be used in other embodiments of the present disclosure. In an embodiment of the present disclosure, blocks 435, 445, 444, 440, 450 and 475 are shown to be sequential while blocks 430 and 465 are shown to be combinational. The other outputs, namely, running-acc-data (491), running-nsample (492) and data-valid (493) are generated by accumulator output blocks 465 and 475, which are additionally implemented in core logic 110 to enable operation in modes 1 and 2, and as described below.

In an embodiment, TDC 100 is designed to operate in the following modes:

1. Accumulator mode, with input clocks clk-in-1 (101-1) and clk-in-2 (101-2) having the same frequency.
2. Accumulator mode, with frequency of input clocks clk-in-1 (101-1) and clk-in-2 (101-2) being integer-related.
3. Continuous single-shot mode
4. One-time single-shot mode In modes (1) and (2), TDC 100 receives (from user via corresponding means not shown) a pre-determined value indicating the number of phase difference samples to be accumulated. In these two modes, TDC 100 generates outputs on paths 115 (output), 493 (data-valid), 491 (running-acc-data) and 492 (running-nsample). At the end of sampling every pre-determined number of samples (referred to as an accumulation cycle hereinafter), TDC 100 asserts data-valid (493) and provides the accumulated phase difference value on path 115 (output). At the end of accumulating each phase difference sample, TDC 100 provides the phase difference value accumulated thus far on path 491 (running-acc-data). Running-nsample (492) indicates the number of samples accumulated in running-acc-data (491). An average of the accumulated values (total accumulated value divided by the number of samples accumulated) may be determined by a component external to TDC 100.

In mode (3), TDC 100 generates phase difference between the pair of the periodic inputs (without accumulation of phase difference samples as in mode 1 and 2), and provides the sequence of phase differences on an additional path (not shown).

In mode (4), TDC 100 operates on pulse inputs, generates a one-time phase difference between the pulses, and provides the phase difference on an additional path (not shown).

Output generator block 390 receives signals window-identifier (332), count1-sub (342-1) and count2-sub (342-2). In an embodiment, signals window-identifier (332), count1-sub (342-1) and count2-sub (342-2) are buffered in a pipeline stage (not shown) that is one-sample deep to enable core logic 110 to meet circuit timing requirements. In an embodiment, the pipeline delay stage is implemented using registers, and the signals are delayed/buffered by one clock cycle of clk-dig-tdc (307).

Output generator block 390 generates signal jitter-indicator on path 395. Signal jitter-indicator (395) is used to indicate jitter in either of the input clocks, as will be described below in detail. Although 395 is represented as a single path, signals jitter-present (392) and use-jitter-approach (393) are provided on path 395.

Subtraction-unit 430 receives count1-sub on path 342-1 and count2-sub on path 342-2. Subtraction-unit 430 generates running-count-diff on path 433. In an embodiment of the present disclosure, subtraction-unit 430 is implemented as a signed subtraction block. Thus, subtraction-unit 430 generates a signed difference between count1-sub (342-1) and count2-sub (342-2). Running-count-diff (433) represents the stream of time differences between edges or edge-pairs of input clocks, clk-in-1 (101-1) and clk-in-2 (101-2) within a window.

Positive-min-generator 435 operates to determine the smallest positive value among/between a set of difference values (running-count-diff (433)) generated by subtraction-unit 430 in each window identified by window-identifier-block 420, i.e., between a pair of successive positive (rising) edges of the slower of the two input clocks. Positive-min-generator 435 receives running-count-diff on path 433 and window-identifier on path 332, and generates pos-min on path 436. In an embodiment of the present disclosure, positive-min-generator 435 is implemented as a sequential block clocked by clk-dig-tdc (307), and operates according to the following logic:

If window-identifier signal (332) is a logic HIGH and running-count-diff (433) is zero or a positive value, then pos-min (436) is recorded as running-count-diff (433). Else, if window-identifier signal (332) is a logic HIGH and running-count-diff (433) is non-zero and a negative value, then pos-min (436) is recorded as full-scale positive value. In other word, if count-1 (104-1) and count-2 (104-2) consist of P bits each, then full-scale positive value is $+(2^P-1)$, referred to as 'max1' hereinafter. Else, if running-count-diff (433) is a positive value and less than pos-min (436), then pos-min (436) is updated to running-count-diff (433). Thus, positive-min-generator 435 operates to determine the minimum positive value of running-count-diff (433) between two successive window-identifier (332) pulses.

Negative-max-generator 445 operates to determine the greatest negative value among/between a set of difference values (running-count-diff (433)) generated by subtraction-unit 430 in each window identified by window-identifier-block 420, i.e., between a pair of successive positive (rising) edges of the slower of the two input clocks. Negative-max-generator 445 receives running-count-diff on path 433 and window-identifier on path 332, and generates neg-max on path 346. In an embodiment of the present disclosure, negative-max-generator 445 is implemented as a sequential block clocked by clk-dig-tdc (307), and operates on the following logic:

If window-identifier signal (332) is a logic HIGH and running-count-diff (433) is zero or a negative value, then neg-max (346) is recorded as running-count-diff (433). Else, if window-identifier signal (332) is a logic HIGH and running-count-diff (433) is non-zero and a positive value, then neg-max (346) is recorded as full-scale negative value. In other word, if count-1 (104-1) and count-2 (104-2) consist of P bits each, then full-scale negative value is $-(2^{P-1})$, referred to as 'max2' hereinafter. Else, if running-count-diff (433) is a negative value and greater than neg-max (346) value, then neg-max (346) is updated to running-count-diff (433). Thus, negative-max-generator 445 operates to determine the maximum negative value of running-count-diff (343) between two window-identifier (332) pulses.

nSample-counter 444 receives pos-min (436), neg-max (346) and jitter-indicator (395), and generates signal nsample-done on path 447. In an embodiment, nSample-counter 444 increments a value of a counter upon the end of each window, and asserts nsample-done (447) when the counter value equals the pre-determined number of phase difference samples provided as user input. When the received value of jitter-present (392) is a logic HIGH, nSample-counter 444 asserts nsample-done on path 447 (ending the current accumulation cycle) and resets the value of the counter to zero (indicating the start of a new accumulation cycle).

Accumulator-positive 440 receives pos-min on path 436, neg-max on path 446, window-identifier on path 332, nsample-done on path 447, jitter-indicator on path 395, and generates acc-pos-q on path 442. In an embodiment, the value of 'max1' noted above is a threshold value of accumulator-positive 440 which forms a basis for indicating presence of jitter, as will be described below in detail.

In an embodiment, when the value received on path 392 (jitter-present) is a logic HIGH (indicating that jitter is present in either one of the input clocks), accumulator-positive 440 resets to a boundary value (e.g., zero).

In an embodiment, when the value received on path 393 (use-jitter-approach) is a logic LOW (indicating that no jitter is present in the input clocks), accumulator-positive 440 accumulates (adds) the received pos-min (436) values. In other words, accumulator-positive 440 disregards received neg-max (446) values when use-jitter-approach (393) is a logic LOW.

When the value received on path 393 (use-jitter-approach) is a logic HIGH (indicating that jitter is present in the input clocks), accumulator-positive 440 operates using the following approach:

Accumulator-positive 440 computes a lower magnitude (absolute minimum) of pos-min (436) and neg-max (446) received in each window, and accumulates (adds) the computed value (with the corresponding sign) to the current value of accumulator-positive 440. For example, in a window, if the value of pos-max (436) is received as '+1' and the value of neg-max (446) is received as '−2', accumulator-positive 440 adds '+1' to the current value in accumulator-positive 440. As a further example, in a window, if the value of pos-max (436) is received as '+3' and the value of neg-max (446) is received as '−2', accumulator-positive 440 computes the lower magnitude value as '2', and adds '−2' (with the sign) to the current value in accumulator-positive 440.

Accumulator-negative 450 receives neg-max on path 346, window-identifier on path 332, nsample-done on path 447 jitter-indicator on path 395, and generates acc-neg-q on path 452. In an embodiment, the value of 'max2' noted above is a threshold value of accumulator-negative 450 which forms a basis for indicating presence of jitter, as will be described below in detail.

In an embodiment, when the value received on path 392 (jitter-present) is a logic HIGH (indicating that jitter is present in either one of the input clocks), accumulator-positive 440 resets the accumulated value acc-pos-q (442) to a boundary value (e.g., zero).

In an embodiment, when the value received on path 393 (use-jitter-approach) is a logic LOW (indicating that no jitter is present in the input clocks), accumulator-negative 450 accumulates (adds) the received neg-max (346) values. When the value received on path 393 (use-jitter-approach) is a logic HIGH (indicating that jitter is present in either one of the input clocks), accumulator-negative 450 does not accumulate any values.

Acc-pos-q (442) and acc-neg-q (452) are examined by running-accumulator-data-generator 465 and accumulator-valid-data-generator 475 to determine outputs (running-acc-data, 491 and output, 115) in modes (1) and (2) noted above. Blocks 440, 450, 465 and 475 together comprise accumulation logic operable to generate corresponding outputs in accumulation modes of operation of TDC 100.

Running-accumulator-data-generator 465 receives acc-pos-q (442), acc-neg-q (452), jitter-indicator on path 395, and generates running-acc-data on path 491, running-nsample on path 492.

In an embodiment, when the value received on path 393 (use-jitter-approach) is a logic LOW (indicating that jitter is not present in the input clocks), running-accumulator-data-generator 465 determines a lower magnitude (absolute minimum value) of acc-pos-q (442) and acc-neg-q (452) and provides it on path 491. When the value received on path 393 (use-jitter-approach) is a logic HIGH (indicating that jitter is present in the input clocks), running-accumulator-data-generator 465 forwards the values received on path 442 (acc-pos-q) and disregards acc-neg-q (452). Running-nsample (492) indicates the number of samples accumulated in running-acc-data (491).

Accumulator-valid-data-generator 475 receives acc-pos-q (442), acc-neg-q (452), nsample-done (447), and jitter-indicator (395), and generates signal data-valid on path 493 and output on path 115. At the end of accumulating every pre-determined number of samples (indicated by nsample-done, 447), accumulator-valid-data-generator 475 asserts data-valid (493) and provides the accumulated phase difference on path 115.

In an embodiment, when the value received on path 392 (jitter-present) is a logic HIGH, accumulator-valid-data-generator 475 resets the current accumulated value to a boundary value (e.g., zero). When the value received on path 393 (use-jitter-approach) is a logic LOW (indicating that jitter is not present in the input clocks), accumulator-valid-data-generator 475 determines a lower magnitude (absolute minimum) of acc-pos-q (442) and acc-neg-q (452) received at the end of an accumulation cycle and provides the same on path 115 until the end of the next accumulation cycle. When the value received on path 393 (use-jitter-approach) is a logic HIGH (indicating that jitter is present in the input clocks), accumulator-valid-data-generator 475 forwards the value received on path 442 (acc-pos-q) at the end of an accumulation cycle, and provides the value as the accumulated phase difference on path 115 until the end of the next accumulation cycle. In other words, when the value received on path 393 (use-jitter-approach) is a logic HIGH (indicating that jitter is present in the input clocks), accumulator-valid-data-generator 475 disregards acc-neg-q (452).

Jitter-detector 460 receives acc-pos-q (442) and acc-neg-q (452), and generates jitter-indicator signal on path 395. As noted above, signal jitter-indicator (395) is used to indicate that jitter is present in either of the input clocks.

As noted above, jitter-detector 460 generates signals jitter-present (392) and use-jitter-approach (393) on path 395. In an embodiment, a logic LOW on path 392 (jitter-present) indicates that there is no jitter in the input clocks, and a logic HIGH on path 392 (jitter-present) indicates that jitter is present in either of the input clocks. Jitter-present (392) is set to logic LOW by default. Jitter-detector 460 checks if the values of both acc-pos-q (442) and acc-neg-q (452) have exceeded respective thresholds ('max1' and 'max2' respectively). If so, jitter-detector 460 generates a logic HIGH on path 392 indicative of presence of jitter in either one of input clocks, clk-in-1 (101-1) and clk-in-2 (101-2). In the illustrative embodiment, jitter-present (392) signal is de-asserted after one clock cycle of clk-dig-tdc (307). Accordingly, the pulse width of jitter-present (392) signal is equal to one clock cycle of clk-dig-tdc (307).

In an embodiment, signal use-jitter-approach (393) is a logic LOW by default. When jitter is determined to be present, jitter-detector 460 generates a logic HIGH on path 393. Jitter-detector 460 keeps signal use-jitter-approach (393) in an asserted state (logic HIGH) for a duration equal to the pre-determined number of windows provided by user for accumulation of phase difference samples. Jitter-detector 460 determines the end of pre-determined number of windows based on nsample-done received on 447 (not shown).

Although, in the illustrative embodiment, detection of jitter is shown to be performed by jitter-detector (460) implemented external to blocks running-accumulator-data-generator (465) and accumulator-valid-data-generator (475), in alternative embodiments, jitter-detector 460 may be implemented as part of either of blocks running-accumulator-data-generator (465) or accumulator-valid-data-generator (475).

The implementation details of unique-generator-1 and unique-generator-2 in an embodiment of the present disclosure are provided next.

8. Unique-Count Generator

Figure 5:
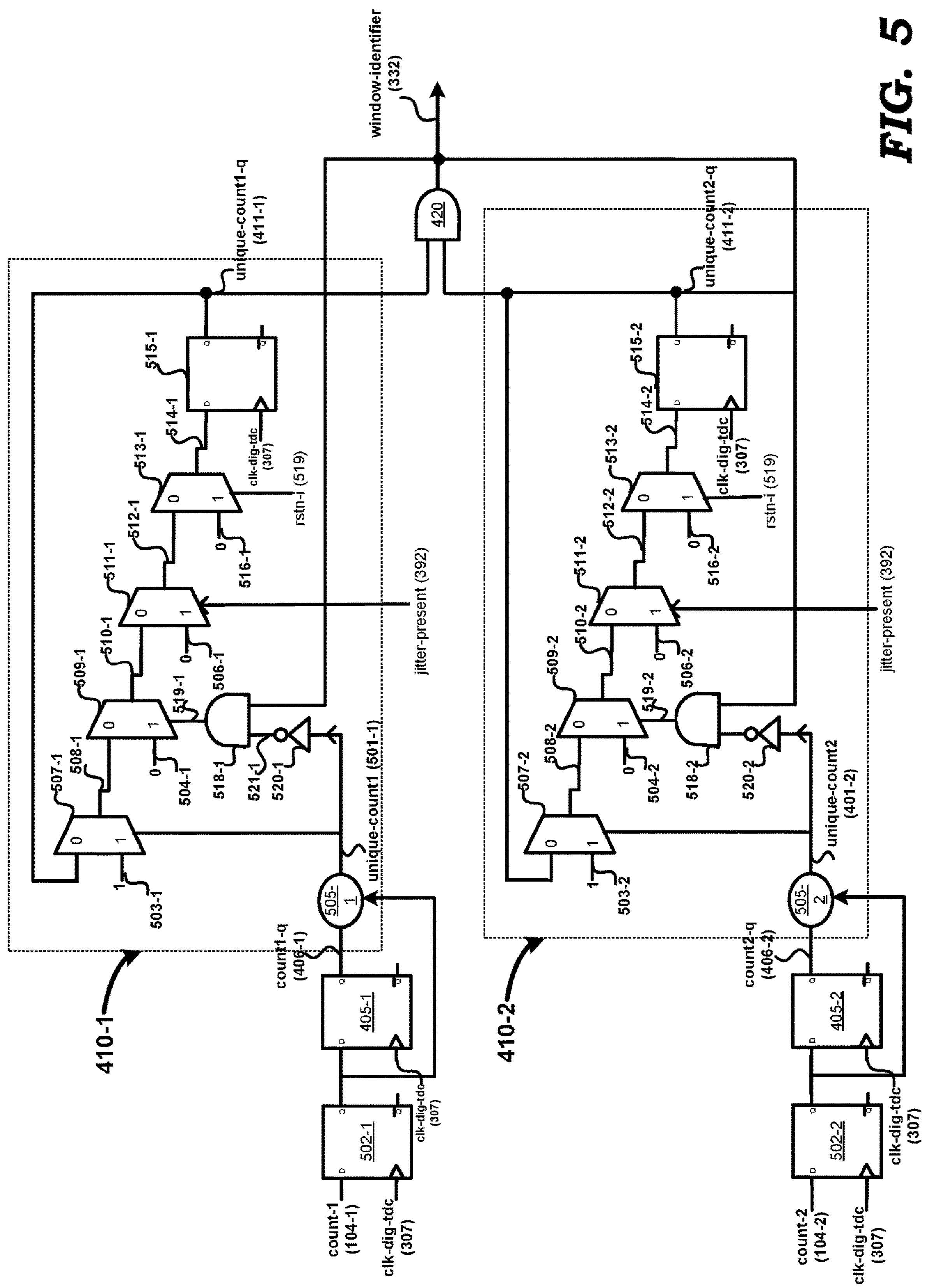
FIG. 5 is a block diagram illustrating the implementation details of a unique-count-generator and a window-identifier-block used in the generation of each phase difference value in an embodiment of the present disclosure.

FIG. 5 is a block diagram illustrating the implementation details of a unique-count generator in an embodiment of the present disclosure. FIG. 5 is shown containing count1-q-generator 405-1, unique-generator-1 410-1, count2-q-generator 305-2, unique-generator-2 410-2 and window-identifier-block 420. Unique-generator-1 410-1 in turn is shown containing Logic-block 505-1, multiplexers (MUXes) 507-1, 509-1, 511-1, 513-1, flip-flop 515-1, inverter 520-1 and AND gate 518-1. Unique-generator-2 410-2 in turn is shown containing Logic-block 505-2, multiplexers 507-2, 509-2, 511-2, 513-2, flip-flop 515-2, inverter 520-2 and AND gate 518-2. The specific blocks and interconnections of FIG. 5 are shown merely by way of example. More or fewer blocks can be used in other embodiments of the present disclosure.

Logic-block 505-1 receives count-1 (104-1) and count1-q (406-1) and generates unique-count1 (501-1). In an embodiment, logic-block 505-1 generates a logic HIGH on path 501-1 if count-1 (104-1) and count1-q (406-1) are unequal, and a logic LOW otherwise. Thus, logic-block 505-1 implements the logic: unique-count1=(count-1 !=count1-q).

MUX 507-1 receives a logic HIGH on path 503-1 and unique-count1-q (411-1), and forwards one of logic HIGH and unique-count1-q on path 508-1 as an output (MUX selected output) based on the logic value of select signal 501-1 (unique-count1). Accordingly, when unique-count1-q (501-1) is a logic HIGH, MUX 507-1 forwards logic HIGH (503-1) on path 508-1. When unique-count1-q (501-1) is a logic LOW, MUX 507-1 forwards unique-count1-q (411-1) on path 508-1.

MUX 509-1 receives a logic LOW on path 504-1 and output of MUX 507-1 on path 508-1, and forwards one of logic LOW and MUX output 508-1 on path 510-1 as an output (MUX selected output) based on the logic value of select signal 519-1. Accordingly, when the value on path 519-1 is a logic HIGH, MUX 509-1 forwards logic LOW (504-1) on path 510-1. When the value on path 519-1 is a logic LOW, MUX 509-1 forwards value 508-1 on path 510-1.

MUX 511-1 receives a logic LOW on path 406-1 and output of MUX 509-1 on path 510-1, and forwards one of logic LOW and MUX output 510-1 on path 412-1 as an output (MUX selected output) based on the logic value of select signal jitter-present (392).

Signal jitter-present (392) is received from output generator block 390 (noted above with respect to FIG. 4B), and indicates whether jitter is present in either one of input clocks (clk-in-1, 101-1 and clk-in-2, 101-2). Accordingly, when jitter-present (392) is a logic HIGH (indicating the presence of jitter), MUX 511-1 forwards logic LOW (406-1) on path 512-1. When jitter-present (392) is a logic LOW, MUX 511-1 forwards value 510-1 on path 512-1. Thus, when jitter-present (392) is a logic HIGH, unique-count-1-q (411-1) is set to logic LOW (reset).

MUX 513-1 receives a logic LOW on path 516-1 and output of MUX 511-1 on path 512-1, and forwards one of logic LOW and MUX output 512-1 on path 514-1 as an output (MUX selected output) based on the logic value of select signal rstn-i (519). Rstn-i (519) represents chip reset or power-ON reset. Accordingly, when rstn-i (519) is a logic HIGH, MUX 513-1 forwards logic LOW (516-1) on path 514-1. When rstn-i (519) is a logic LOW, MUX 513-1 forwards value 512-1 on path 514-1.

Flip-flop 515-1 is clocked by clk-dig-tdc (307). Flip-flop 515-1 receives input signal on path 514-1 at its D input and generates output (Q), unique-count1-q, on path 411-1. In an embodiment, flip-flop 515-1 is implemented as a positive edge triggered flip-flop.

AND gate 518-1 receives output of inverter 520-1 on path 521-1 and signal window-identifier on path 532, and generates result of AND operation on path 519-1.

Window-identifier-block 420 receives unique-count1-q (411-1) and unique-count2-q (311-2), and generates signal window-identifier on path 332. Window-identifier-block 420 is implemented as an AND gate in an embodiment of the present disclosure. Thus, window-identifier-block 420 implements the logic: window-identifier=(unique-count1-q && unique-count2-q). In the illustrative embodiment, window-identifier (332) signal is de-asserted after one clock cycle of clk-dig-tdc (307). Accordingly, the pulse width of window-identifier (332) signal is equal to one clock cycle of clk-dig-tdc (307) and the frequency of window-identifier (332) signal is equal to the slower of the two selected input clock (clk-in-1, 101-1 and clk-in-2, 101-2) frequencies (in case of clocks whose frequencies are integer-related).

Components 505-1, 507-1, 509-1, 511-1 and 513-1 together implement the following logic:

```
if (window-identifier && ! unique-count1)
        unique-count1-q = 0
    else if (unique-count1)
        unique-count1-q = 1
```

The expression (window-identifier && !unique-count1) above contains the operators && and ! which respectively represent AND operator and NOT operator. Accordingly, expression (window-identifier && !unique-count1) would evaluate to a 1 when the value of window-identifier is a logic HIGH and the value of unique-count1 is a logic LOW, and to 0 otherwise.

Components 505-2, 520-2, 518-2, 507-2, 509-2, 511-2, 513-2 and 515-2 operate in a manner similar to components 505-1, 520-1, 518-1, 507-1, 509-1, 511-1, 513-1 and 515-1 respectively and the description is not repeated here in the interest of conciseness.

The manner in which unique-count generators and window-identifier-block operate to determine a window is illustrated next with example waveforms.

Figure 6:
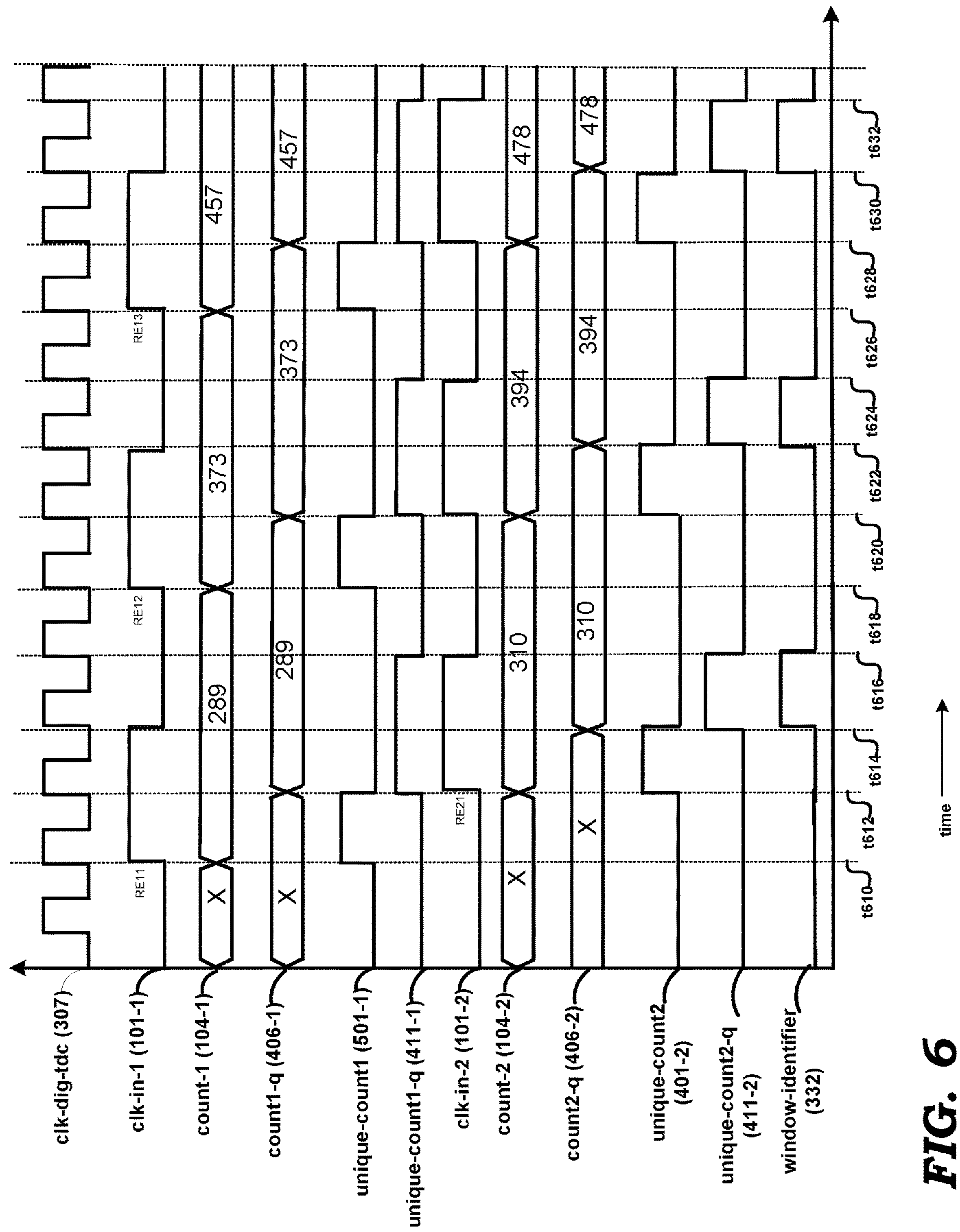
FIG. 6 is a timing diagram illustrating the manner in which a unique-count signal and a window-identifier signal are generated for a pair of input clocks having a same frequency, in an embodiment of the present disclosure.

9. Generation of Unique-Count Signal and Window-Identifier Signal for a Pair of Input Clocks Having the Same Frequency FIG. 6 is a timing diagram (not to scale) illustrating the manner in which unique count signals (501, 411) and signal window-identifier (332) are generated for a pair of input clocks having the same frequency (and a phase difference) in an embodiment of the present disclosure. FIG. 6 shows example waveforms of clk-dig-tdc (307), clk-in-1 (101-1), count-1 (104-1), count1-q (406-1), unique-count1 (501-1), unique-count1-q (411-1), clk-in-2 (101-2), count-2 (104-2), count2-q (406-2), unique-count2 (501-2), unique-count2-q (411-2) and window-identifier (332). In this illustrative embodiment, counts corresponding to input clocks (clk-in-1, 101-1 and clk-in-2, 101-2) are assumed to be 36 bits-wide. The specific count values and the phase difference between clk-in-1 and clk-in-2 shown in FIG. 6 are not to scale, and are meant merely to illustrate the manner in which the unique count values and window-identifier signal are generated. A value of 'X' in data waveforms (count-1 (104-1), count1-q (406-1), count-2 (104-2), count2-q (406-2), running-count-diff (433), pos-min (436), neg-max (446), acc-pos-q (442), acc-neg-q (452)) indicates a 'don't-care' value for the purpose of this illustration.

The value of '289' (count-1, 104-1) received at t610 corresponds to the digital representation of the time of occurrence of rising edge (RE11) of clk-in-1 (101-1), while the value '310' (count-2, 104-2) received at t612 corresponds to the digital representation of the time of occurrence of rising edge (RE21) of clk-in-2 (101-2). Counters (in count logic, 105, not shown) that are sampled by respective input clocks clk-in-1 and clk-in-2 provide the corresponding count values count-1 (104-1) and count-2 (104-2) at the respective rising edges of the input clocks clk-in-1 and clk-in-2. As noted above, the counters corresponding to each pair of input clocks are synchronized, i.e., start counting from the same initial value (e.g., zero) and increment at the same rate. Thus, the counters represent time instances on a same time scale.

Counts corresponding to rising edges of clk-in-1 (101-1) are shown as being received at time instants t610, t618 and t626. Thus, count-1 (104-1) is shown as having values 289 between t610-t618, 373 between t618-t626 and 457 between t626-t632. Count1-q (406-1) is the value of count-1 (104-1) but delayed by one clock cycle of clk-dig-tdc (307) by flip-flop 405-1. Thus, while count-1 (104-1) has the value 289 starting at t610, count1-q (406-1) is shown as having value 289 starting at t612 (after one cycle of clk-dig-tdc (307)). Accordingly, count1-q (406-1) is shown as having values 289 between t612-t620, 373 between t620-t628 and 457 between t628-t632.

Signal unique-count1 (501-1) is asserted when the value of count-1 (104-1) is not equal to the value of count1-q (406-1). In other words, unique-count1 (501-1) is set to a logic HIGH when count of clk-in-1 (101-1) has undergone a change from its value in a previous clock cycle of clk-dig-tdc (307). Accordingly, unique-count1 (501-1) is shown as being asserted only in time intervals t610-t612, t618-t620 and t626-t628, when the value of count-1 (104-1) is not equal to the value of count1-q (406-1).

As noted above, unique-count1-q (411-1) is determined based on the following logic:

```
if (window-identifier && !unique-count1)
        unique-count1-q = 0
    else if (unique-count1)
        unique-count1-q = 1 .................. (Logic 1.1)
```

The above logic is evaluated based on values of window-identifier (332) and unique-count1 (501-1) one clock cycle previous to the current time instant. Thus, at t612, value of window-identifier (332) considered for evaluation is a logic LOW (value in time interval t610-t612) and the value of unique-count1 (501-1) considered for evaluation is a logic HIGH. Accordingly, unique-generator-1 410-1 evaluates Logic 1.1 and sets unique-count1-q (411-1) to a logic HIGH starting at t612.

Counts corresponding to rising edges of clk-in-2 (101-2) are shown as being received at time instants t612, t620 and t628. Thus, count-2 (104-2) is shown as having values 310 between t612-t620, 394 between t620-t628 and 478 between t628-t632. Count2-q (406-2) is the value of count-2 (104-2) but delayed by one clock cycle of clk-dig-tdc (307) by flip-flop 405-2. Thus, while count-2 (104-2) has the value 310 starting at t612, count2-q (406-2) is shown as having value 310 starting at t614 (after one cycle of clk-dig-tdc (307)). Accordingly, count2-q (406-2) is shown as having values 310 between t614-t622, 394 between t622-t630 and 478 between t630-t632.

Signal unique-count2 (501-2) is asserted when the value of count-2 (104-2) is not equal to the value of count2-q (406-2). In other words, unique-count2 (501-2) is set to a logic HIGH when count of clk-in-2 (101-2) has undergone a change from its value in a previous clock cycle of clk-dig-tdc (307). Accordingly, unique-count2 (501-2) is shown as being asserted only in time intervals t612-t614, t620-t622 and t628-t630, when the value of count-2 (104-2) is not equal to the value of count2-q (406-2).

As noted above with respect to FIG. 5, unique-count2-q (411-2) is determined based on the following logic:

```
if (window-identifier && !unique-count2)
        unique-count2-q = 0
else if (unique-count2)
        unique-count2-q = 1 ........... (Logic 1.2)
```

As noted above with respect to unique-count1-q (411-1), the above logic is evaluated based on values of window-identifier (332) and unique-count2 (501-2) one clock cycle previous to the current time instant. Thus, at t612, value of window-identifier (332) considered for evaluation is a logic LOW (value in time interval t610-t612) and the value of unique-count2 (501-2) considered for evaluation is a logic LOW. Accordingly, unique-generator-2 410-2 evaluates Logic 1.2 and unique-count2-q (411-2) remains at a logic LOW starting at t612.

Similarly, at t614, for the evaluation of Logic 1.2, the value of window-identifier (332) is a logic LOW and the value of unique-count2 (501-2) is a logic HIGH. Accordingly, unique-generator-2 410-2 evaluates the above Logic 1.2 and sets unique-count2-q (411-2) to a logic HIGH starting at t614.

When unique-count2-q (411-2) is set to a logic HIGH at t614, window-identifier (332) also goes to logic HIGH as both unique-count1-q (411-1) and unique-count2-q (411-2) are at logic HIGH. As noted above, window-identifier (332) gets de-asserted at t616, i.e., after one clock cycle of clk-dig-tdc (307).

At t616, for the determination of unique-count1-q (411-1), the value of window-identifier (332) is a logic HIGH and the value of unique-count1 (501-1) is a logic LOW. Accordingly, unique-count1-q (411-1) is set to a logic LOW starting at t616.

At t616, for the determination of unique-count2-q (411-2), the value of window-identifier (332) is a logic HIGH and the value of unique-count2 (501-2) is a logic LOW. Accordingly, unique-count2-q (411-2) is set to a logic LOW starting at t616.

The values for unique-count1-q (411-1), unique-count2-q (411-2) and window-identifier (332) are generated in a similar manner for respective time instants up to t632, as depicted in FIG. 6.

Thus, window-identifier (332) is shown as identifying the boundaries of windows, with each window corresponding to a pair of successive edges of an input clock (clk-in-1, 101-1 in this illustration).

The manner in which unique count signals (501, 411) and signal window-identifier (332) are generated for a pair of input clocks having frequencies that are integer-related multiples is described next.

Figure 7:
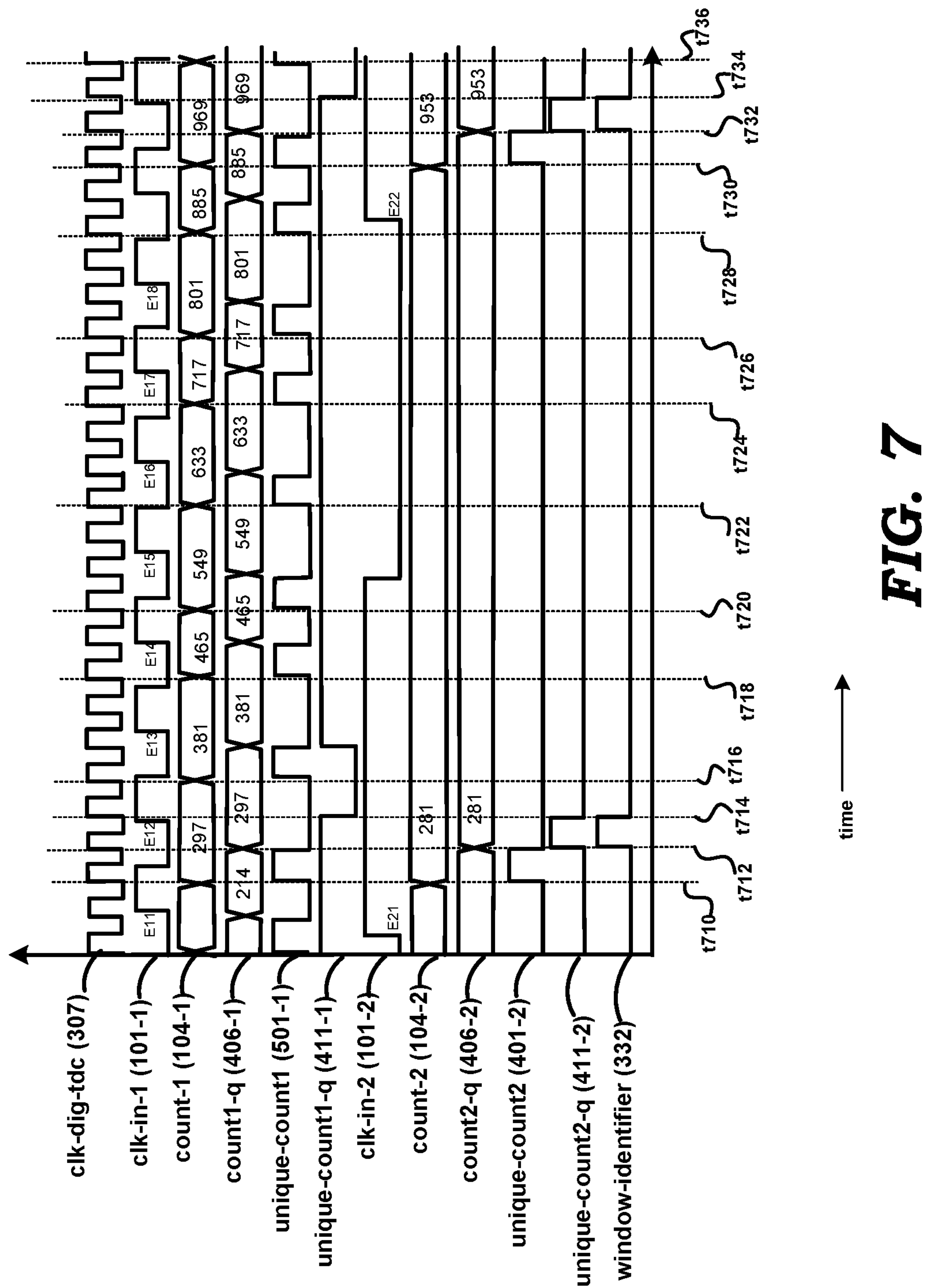
FIG. 7 is a timing diagram illustrating the manner in which a unique-count signal and a window-identifier signal are generated for a pair of input clocks having frequencies that are integer-related multiples greater than one, in an embodiment of the present disclosure.

10. Generation of Unique-Count Signal and Window-Identifier Signal for a Pair of Input Clocks Having Frequencies that are Integer-Related FIG. 7 is a timing diagram (not to scale) illustrating the manner in which unique count signals (410, 311) and signal window-identifier (332) are generated for a pair of input clocks having frequencies that are integer-related multiples, in an embodiment of the present disclosure. In other words, frequency of one input clock (say clk-in-1, 101-1) is M times the frequency of the other input clock (say clk-in-2, 101-2), where M is an integer greater than or equal to 2.

In FIG. 7, M is shown as being 8. Thus, frequency of clk-in-1 (101-1) is 8 times that of clk-in-2 (101-2). Accordingly, 8 rising edges (E11 through E18) of clk-in-1 (101-1) are shown to be present between 2 successive rising edges (E21, E22) of clk-in-2 (101-2).

FIG. 7 shows example waveforms of clk-dig-tdc (307), clk-in-1 (101-1), count-1 (104-1), count1-q (406-1), unique-count1 (501-1), unique-count1-q (411-1), clk-in-2 (101-2), count-2 (104-2), count2-q (406-2), unique-count2 (501-2), unique-count2-q (411-2) and window-identifier (332). In this illustrative embodiment, counts corresponding to input clocks (clk-in-1, 101-1 and clk-in-2, 101-2) are assumed to be of 36 bits.

It is noted here that the rising edges of the input clocks are not synchronous with respect to the measurement clock clk-meas (103) or used in count logic 105 or clk-dig-tdc (307). Accordingly, an uncertainty of up to 3 cycles of clk-dig-tdc (307) may be present between the occurrence of a rising edge and the arrival of the corresponding count. For example, count-1 (104-1) corresponding to rising edge E11 of clk-in-1 (101-2) is shown as being received at t710, slightly later than the actual occurrence of the rising edge.

Counts corresponding to rising edges of clk-in-1 (101-1) are shown as being received at time instants t710, t716, t718, t720, t722, t724, t726, t728 and t730. Thus, count-1 (104-1) is shown as having values 297 between t710-t716, 381 between t716-618, 465 between t718-t720, 549 between t720-t722, 633 between t722-t724, 717 between t724-t726, 801 between t726-t728, 885 between t728-t730 and 969 between t730-t736. Count1-q (406-1) is the value of count-1 (104-1) but delayed by one clock cycle of clk-dig-tdc (307) by flip-flop 305-1. Thus, while count-1 (104-1) has the value 297 starting at t710, count1-q (406-1) is shown as having value 297 starting at t712 (after one cycle of clk-dig-tdc (307)). Accordingly, each value of count1-q (406-1) is shown to be delayed by one cycle of clk-dig-tdc (307) with respect to a respective value of count-1 (104-1) in FIG. 7.

Signal unique-count1 (501-1) is asserted when the value of count-1 (104-1) is not equal to the value of count1-q (406-1). In time interval t710-t712, count-1 (104-1) has a value 297 while count1-q (406-1) has a value 214, and therefore unique-count1 (501-1) is shown as being asserted in time interval t710-t712. Each respective value of unique-count1 (501-1) is set to a logic HIGH in a time interval when the corresponding value of count-1 (104-1) is not equal to the value of count1-q (406-1) in that time interval.

Prior to t710, unique-count1-q (411-1) is shown as having a logic HIGH value. Unique-count1-q (411-1) is determined according to Logic 1.1 noted above. Logic 1.1 is evaluated based on values of window-identifier (332) and unique-count1 (501-1) one clock cycle previous to the current time instant. Thus, at t712, value of window-identifier (332) considered for evaluation is a logic LOW (value in time interval t710-t712) and the value of unique-count1 (501-1) considered for evaluation is a logic HIGH. Accordingly, unique-1-generator 310-1 evaluates the above logic and continues to keep unique-count1-q (411-1) at a logic HIGH at t712.

At t714, for the determination of unique-count1-q (411-1), the value of window-identifier (332) is a logic HIGH and the value of unique-count1 (501-1) is a logic LOW. Accordingly, unique-1-generator 310-1 evaluates the above logic and de-asserts unique-count1-q (411-1) starting at t714.

Signal unique-count2 (501-2) is asserted when the value of count-2 (104-2) is not equal to the value of count1-q (406-2). Thus, unique-count2 (501-2) is shown as being asserted only in time intervals t710-t712 and t730-t732.

Unique-count2-q (411-2) is determined in a manner similar to that of unique-count1-q (411-1). Thus, unique-count2-q (411-2) is shown as being asserted in time interval t712-t714 (as the value of window-identifier, (332) considered for evaluation is a logic LOW and the value of unique-count2 (501-2) considered for evaluation is a logic HIGH). Similarly, unique-count2-q (411-2) is also asserted in time interval t732-t734.

At 612, when unique-count2-q (411-2) is set to a logic HIGH, window-identifier (332) also goes to logic HIGH as both unique-count1-q (411-1) and unique-count2-q (411-2) are at logic HIGH. As noted above, window-identifier (332) gets de-asserted at t714, i.e., after one clock cycle of clk-dig-tdc (307). Similarly, window-identifier (332) gets asserted again in time interval t732-t734.

Phase difference of a pair of input clocks whose frequencies are integer-related multiples is the time between occurrence of an edge of the slower clock and the nearest edge of the faster clock. Thus, window-identifier (332) pulses are shown as being generated upon occurrence of rising edges of clk-in-2 (101-2) (slower clock) in FIG. 7, thus identifying the boundaries of windows for generation of a respective output upon the end of each window.

The various blocks of a core logic as described in detail above enable TDC 100 in generating digital values representing the phase difference between a pair of periodic inputs whose frequencies are related to each other by an integer value, i.e., whose frequencies are the same or that are integer-related multiples (e.g., 2×, 3×, etc.). The manner in which TDC 100 determines the phase difference for each of the above scenarios is illustrated below with respect to example diagrams.

Figure 8A:
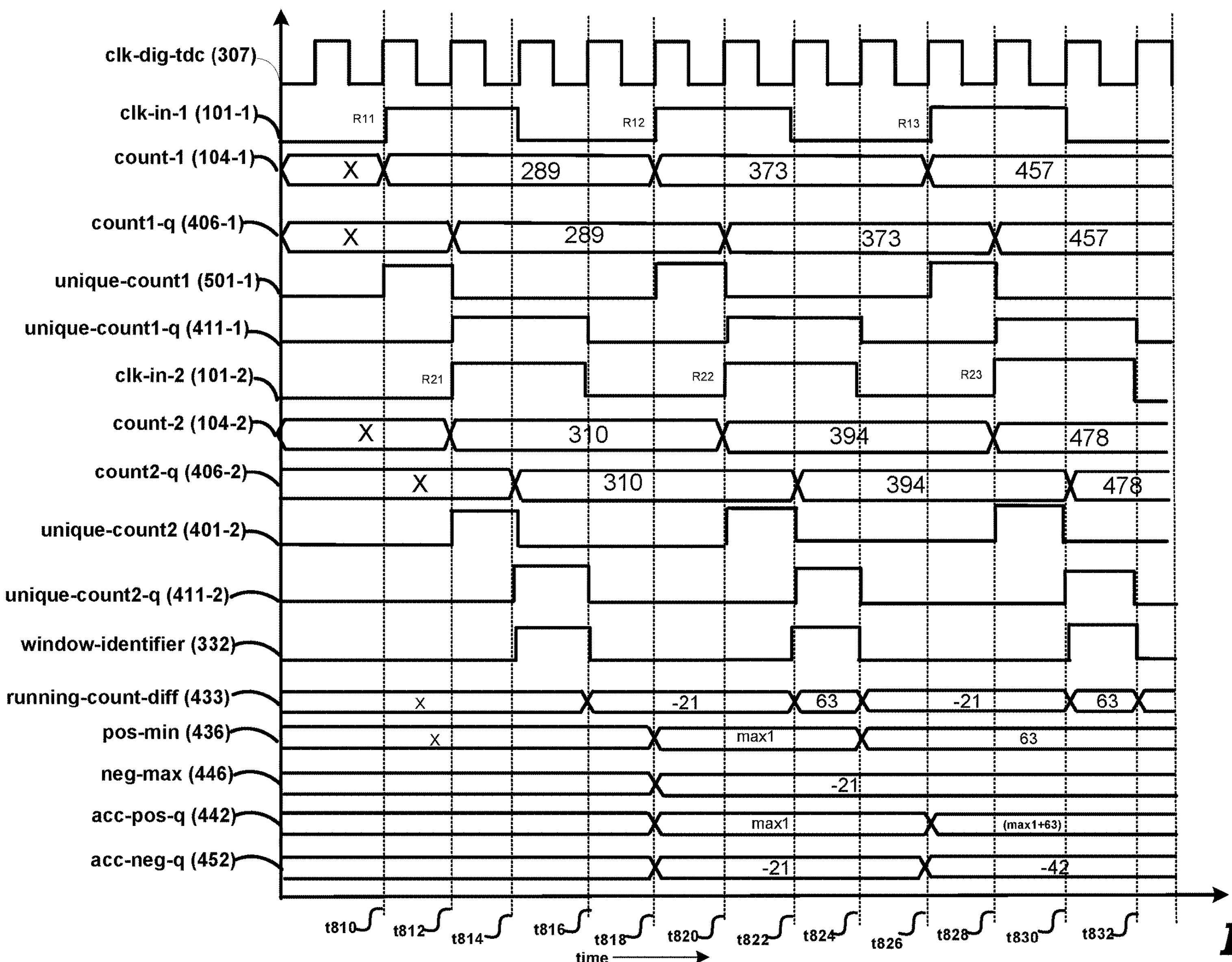
FIG. 8A is a timing diagram illustrating the operation of a TDC for a pair of input clocks having the same frequency, in an embodiment of the present disclosure.

11. Determining Phase Difference Between a Pair of Input Clocks Having the Same Frequency FIG. 8A is an example timing diagram (not to scale) illustrating the manner in which TDC 100 determines the phase difference between a pair of clocks having the same frequency. FIG. 8A shows example waveforms of clk-dig-tdc (307), clk-in-1 (101-1), count-1 (104-1), count1-q (406-1), unique-count1 (501-1), unique-count1-q (411-1), clk-in-2 (101-2), count-2 (104-2), count2-q (406-2), unique-count2 (501-2), unique-count2-q (411-2) and window-identifier (332). Waveforms clk-dig-tdc (307), clk-in-1 (101-1), count-1 (104-1), count1-q (406-1), unique-count1 (501-1), unique-count1-q (411-1), clk-in-2 (101-2), count-2 (104-2), count2-q (406-2), unique-count2 (501-2), unique-count2-q (411-2) and window-identifier (332) correspond to those shown in FIG. 7 and their description is not repeated here in the interest of brevity.

Additionally, FIG. 8A shows example waveforms running-count-diff (433), pos-min (436), neg-max (446), acc-pos-q (442) and acc-neg-q (452). A value of 'X' in data waveforms (count-1 (104-1), count1-q (406-1), count-2 (104-2), count2-q (406-2), running-count-diff (433), pos-min (436), neg-max (446), acc-pos-q (442), acc-neg-q (452)) indicates a 'don't-care' value for the purpose of this illustration. Value 'max1' in data waveform pos-min (436) represents the maximum positive threshold value, i.e., $(2^{36}-1)$ in this case.

Rising edges R11 through R13 of clk-in-1 (101-1) are shown to be occurring at respective time instants t810, t818 and t826. Accordingly, digital core 110 receives values of count-1 (104-1) as 289, 373 and 457 respective to each rising edge of clk-in-1 (101-1).

Similarly, rising edges R21 through R23 of clk-in-2 (101-2) are shown to be occurring at respective time instants t812, t820 and t828. Accordingly, digital core 110 receives values of count-2 (104-2) as 310, 394 and 478, respective to each rising edge of clk-in-2 (101-2). Thus, in the illustrative embodiment, clk-in-2 (101-2) is shown to be lagging in phase (by approximately 90 degrees) with respect to clk-in-1 (101-1).

Although counts (count-1, 104-1 and count-2, 104-2) corresponding to rising edges of input clocks (clk-in-1, 101-1 and clk-in-2, 101-2) are shown to be received synchronous with the respective rising edges, in practice, counts may be received slightly later than the occurrence of corresponding rising edges of clk-in-1 (101-1) and clk-in-2 (102-2).

In response to count-2 (104-2) changing its value (to 310) at t812, window-identifier (332) is asserted at t814 for one clock cycle of clk-dig-tdc (307). Thus, starting at t816, phase differences between clk-in-1 (101-1) and clk-in-2 (101-2) are measured.

Running-count-diff (433) is shown as having the following values in respective time intervals, based on value of (count1-q (406-1) minus count2-q (406-2)) in the durations (based on pipeline delay noted above):

t816-t818: running-count-diff (433)=289−310=−21
t818-t820: running-count-diff (433)=289−310=−21
t820-t822: running-count-diff (433)=289−310=−21
t822-t824: running-count-diff (433)=373−310=63

The phase difference in duration t816-t822 represents the phase difference between rising edge R21 of clk-in-2 (101-2) and rising edge R11 of clk-in-1 (101-1), while the phase difference in duration t822-t824 represents the phase difference between rising edge R12 of clk-in-2 (101-2) and rising edge R12 of clk-in-1 (101-1).

At t818, positive-min-generator 335 receives a logic HIGH on path 332 (window-identifier) and a value of '−21' on path 433 (running-count-diff). Therefore, positive-min-generator 335 sets the value of pos-min (436) to max1 at t818.

At t820, positive-min-generator 335 receives a logic LOW on path 332 (window-identifier) and a value of '−21' on path 433 (running-count-diff). Therefore, positive-min-generator retains the current value of pos-min (436), i.e., max1, at t820. In this manner, values of pos-min (436) are shown to be updated based on values of window-identifier (332), running-count-diff (433) and the current value of pos-min (436).

At t818, negative-max-generator 345 receives a logic HIGH on path 332 (window-identifier) and a value of '−21' on path 433 (running-count-diff). Therefore, negative-max-generator 345 sets the value of neg-max (446) to the value of running-count-diff (433), i.e., '−21'.

At t820, negative-max-generator 345 receives a logic LOW on path 332 (window-identifier) and a value of '−21' on path 433 (running-count-diff). Therefore, negative-max-generator 345 retains the current value of neg-max (446), i.e., '−21' at t820. In this manner, values of neg-max (446) are shown to be updated/retained based on values of window-identifier (332), running-count-diff (433) and the current value of neg-max (446).

Using similar operations as illustrated above, TDC 100 determines the phase difference between periodic clock inputs having equal frequencies for other values of phase difference (leading or lagging).

The manner in which TDC 100 determines the phase difference between a pair of input clocks having frequencies that are integer-related multiples (2× or greater) is illustrated next with an example.

Figure 8B:
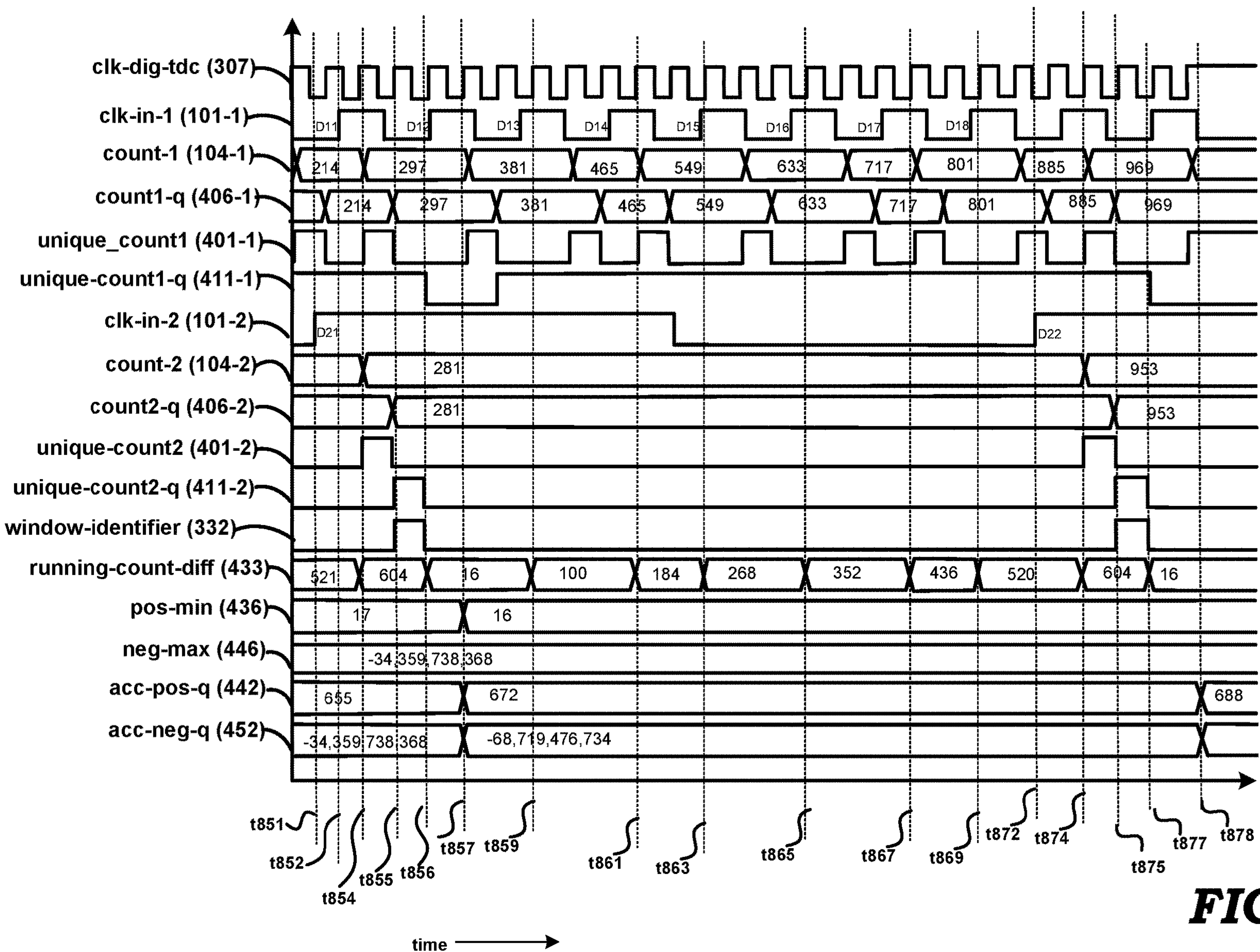
FIG. 8B is a timing diagram illustrating the operation of a TDC for a pair of input clocks having frequencies that are integer-related, in an embodiment of the present disclosure.

12. Determining Phase Difference Between a Pair of Input Clocks Having Frequencies that are Integer-Related Multiples FIG. 8B is a timing diagram (not to scale) illustrating the manner in which TDC 100 measures phase differences between a pair of clocks having frequencies that are integer-related multiples. FIG. 8B shows example waveforms of clk-dig-tdc (307), clk-in-1 (101-1), count-1 (104-1), count1-q (406-1), unique-count1 (501-1), unique-count1-q (411-1), clk-in-2 (101-2), count-2 (104-2), count2-q (406-2), unique-count2 (501-2), unique-count2-q (411-2), window-identifier (332), running-count-diff (433), pos-min (436), neg-max (446), acc-pos-q (442) and acc-neg-q (452). The waveforms correspond to those shown in FIG. 8A and their description is not repeated here in the interest of brevity. In this illustrative embodiment, counts corresponding to input clocks (clk-in-1, 101-1 and clk-in-2, 101-2) are assumed to be of 36 bits.

As noted above with respect to FIG. 7, frequency of clk-in-1 (101-1) is shown as being 8 times that of clk-in-2 (101-2). Accordingly, 8 rising edges (D11 through D18) of clk-in-1 (101-1) are shown to be present between 2 consecutive rising edges (D21, D22) of clk-in-2 (101-2).

Also, as noted above with respect to FIG. 7, count-1 (104-1) and count-2 (104-2) are received slightly later than the occurrence of corresponding rising edges of clk-in-1 (101-1) and clk-in-2 (102-2) respectively. Thus, count-1 (104-1) received at t854 corresponds to rising edge D11 of clk-in-1 (101-1) shown to be occurring at t852, while count-2 (104-2) received at t854 corresponds to rising edge D21 of clk-in-2 (101-2) shown to be occurring at t851.

In response to count-2 (104-2) changing its value (to 281) at t854, window-identifier (332) is asserted at t855 for one clock cycle of clk-dig-tdc (307). Thus, starting at t856 (one clock cycle after window-identifier, 332, is asserted), phase differences are measured between rising edge D21 of slower clock clk-in-2 (101-2) and each rising edge (D11 through D18) of faster clock clk-in-1 (101-2) present between two successive edges D21 and D22 of slower clock clk-in-2 (101-2).

Running-count-diff (433) is shown as having the following values in respective time intervals, based on value of (count1-q (406-1) minus count2-q (406-2)) in the durations (based on pipeline delay noted above):

t856-t859: running-count-diff (433)=297−281=16
t859-t861: running-count-diff (433)=381−281=100
t861-t863: running-count-diff (433)=465−281=184
t863-t865: running-count-diff (433)=549−281=268
t865-t867: running-count-diff (433)=633−281=452
t867-t869: running-count-diff (433)=717−281=436
t869-t874: running-count-diff (433)=801−281=520
t874-t877: running-count-diff (433)=885−281=604

Thus, running-count-diff (433) is shown as having 8 distinct values, with each value representing the phase difference between rising edge D21 of clk-in-2 (101-2) and a corresponding one of rising edges D11 through D18 (of clock clk-in-1, 101-1).

Prior to t857, pos-min (436) is shown as having a value of 17 as a result of a previous (not shown) minimum phase difference between two consecutive rising edges of clk-in-2 (101-2). At t857, positive-min-generator 335 receives the value of running-count-diff (433) as 16 and a logic HIGH on path 332 (window-identifier), Therefore, positive-min-generator 335 updates pos-min (436) to the value of running-count-diff (433), i.e., 16, at t857. Between t857 and t876, since none of running-count-diff (433) values exceeds the current value of 16, positive-min-generator 335 retains the value of pos-min (436) at its current value, i.e., 16.

Prior to t857, neg-max (446) is shown as having a large negative value of ($-2^{36-1}$). Starting at t857, since all phase difference values are positive, negative-max-generator 345 retains neg-max (446) at the large negative value.

At t875, window-identifier (332) signal is asserted again, indicating the occurrence of the next rising edge (D22) of clk-in-2 (101-2). It may be observed that the value of 16 is the minimum phase difference amongst all 8 differences measured between two window-identifier (332) pulses. Accordingly, phase difference between clk-in-1 (101-2) and clk-in-2 (101-2) is determined to be 16 at t875. As noted above, phase difference of a pair of input clocks whose frequencies are integer-related multiples is the time between occurrence of an edge of the slower clock and the nearest edge of the faster clock.

According to another aspect of the present disclosure, TDC 100 operates to generate phase differences when jitter is present in either one of input clocks. The manner in which TDC operates in the presence of jitter is described next with an example.

13. Operation of TDC when Jitter is Present in Input Clock Signals

Figure 9A:
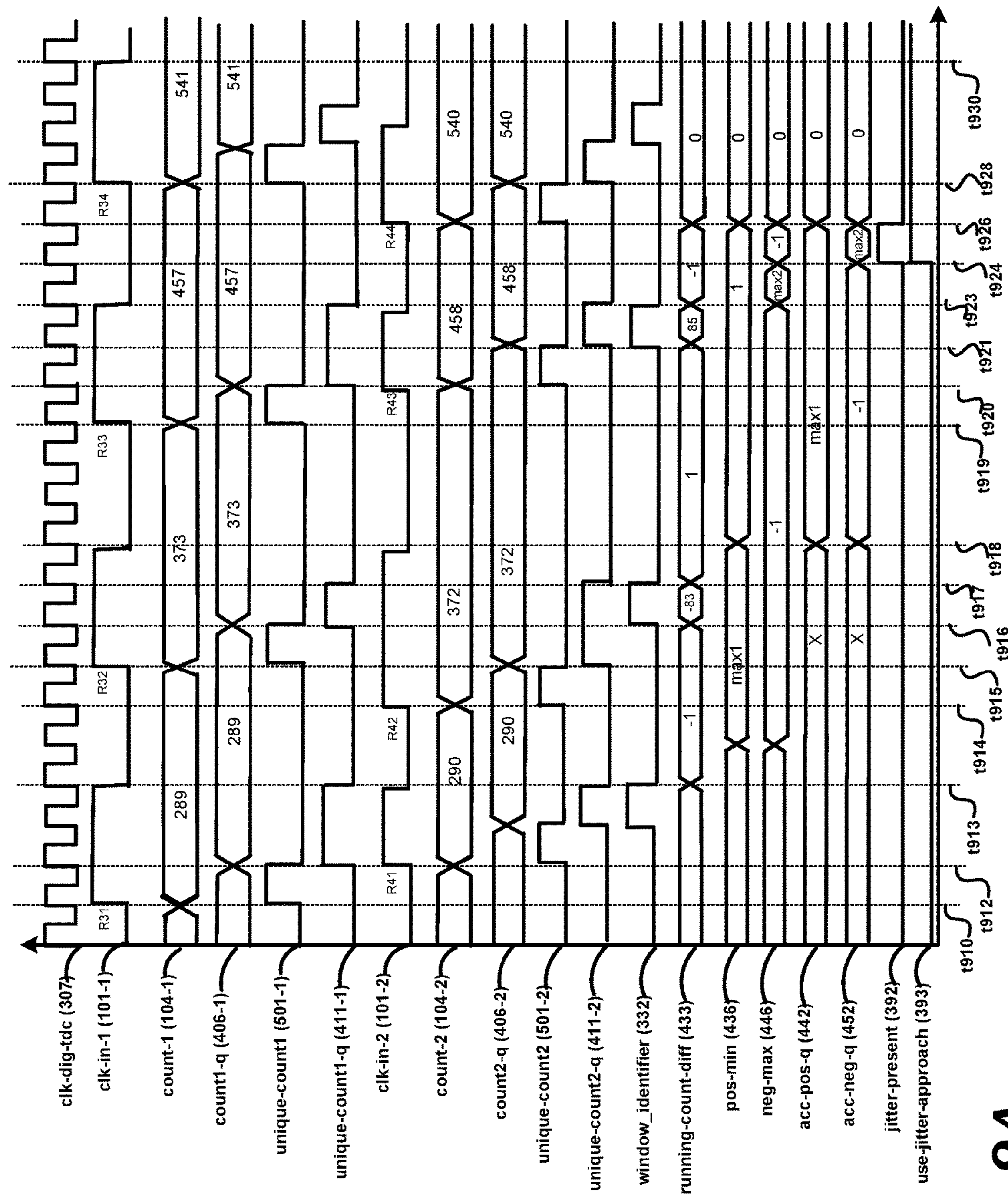
FIG. 9A is a timing diagram illustrating the operation of a TDC for detecting jitter when jitter is present in either of the input clocks, in an embodiment of the present disclosure.
Figure 9B:
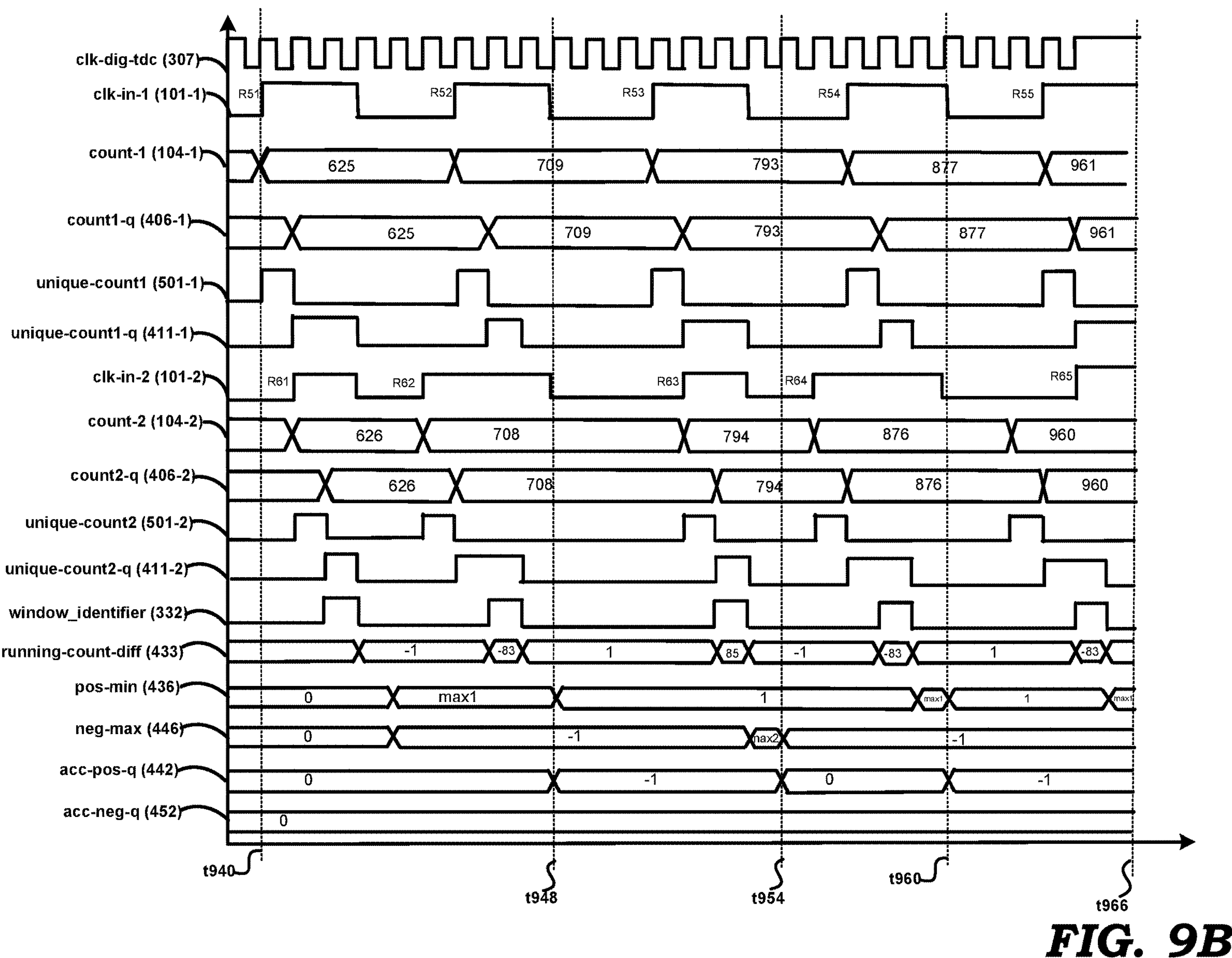
FIG. 9B is a timing diagram illustrating the operation of a TDC in the presence of jitter in either one of input clocks, in an embodiment of the present disclosure.

FIGS. 9A and 9B together illustrate the operation of a TDC with input clock signals with jitter, in an embodiment of the present disclosure. Specifically, FIG. 9A is a timing diagram (not to scale) illustrating the manner in which TDC 100 identifies that jitter is present in input clock signals. FIG. 9A shows example waveforms of clk-dig-tdc (307), clk-in-1 (101-1), count-1 (104-1), count1-q (406-1), unique-count1 (501-1), unique-count1-q (411-1), clk-in-2 (101-2), count-2 (104-2), count2-q (406-2), unique-count2 (501-2), unique-count2-q (411-2), window-identifier (332), running-count-diff (433), pos-min (436), neg-max (446), acc-pos-q (442) and acc-neg-q (452). The waveforms correspond to those shown in FIG. 8A and their description is not repeated here in the interest of brevity. Additionally, FIG. 9A shows example waveforms jitter-present (392) and use-jitter-approach (393). In this illustrative embodiment, counts corresponding to input clocks (clk-in-1, 101-1 and clk-in-2, 101-2) are assumed to be of 36 bits.

In the illustrative embodiment, input clocks clk-in-1 (101-1) and clk-in-2 (101-2) represent a pair of clocks having the same frequency, with accompanying jitter in clk-in-2 (101-2). Rising edges R31 through R34 of clk-in-1 (101-1) are shown to be occurring at respective time instants t910, t915, t919 and t928. Accordingly, digital core 110 receives values of count-1 (104-1) as 289, 373 457 and 541 respective to each rising edge of clk-in-1 (101-1).

In FIG. 9A, clk-in-2 (101-2) is shown to be having jitter. Accordingly, some of the rising edges of clk-in-2 (101-2) (such as edges R42 and R44) are shown to be occurring slightly ahead of corresponding rising edges of clk-in-1 (101-1) (i.e., R32 and R34 respectively), such as at time instants t914 and t926 in some cycles, while some of the rising edges of clk-in-2 (101-2) (such as edges R41 and R43) are shown as occurring slightly later than corresponding rising edges of clk-in-1 (101-2) (i.e., R31, and R33 respectively), such as at time instants t912 and t920 in some cycles.

Running-diff (433) is shown as having the following values in respective time intervals, based on value of (count1-q (406-1) minus count2-q (406-2)) in the durations (based on pipeline delay noted above):

t913-t916: running-count-diff (433)=289−290=−1 t916-t917: running-count-diff (433)=289−372=−83 t917-t921: running-count-diff (433)=373−372=1 t921-t923: running-count-diff (433)=457−372=85

Thus, jitter in clk-in-2 (101-2) is shown to be resulting in positive and negative phase differences. It may be observed that the probabilities that jitter causes a positive phase error and a negative phase error may be substantially equal in some types of jitter (such as random jitter).

Positive-min-generator 435 and negative-max-generator 445 operate according to logic noted above, and therefore, generate pos-min (436) and neg-max (446) values as shown in FIG. 9A. At t916, window-identifier (232) is asserted, and therefore at t918, pos-min (436) value is added to the current accumulated value in accumulator-positive 440. Thus, starting at t918, acc-pos-q (442) is shown to be having the value 'max1'.

At t916, window-identifier (232) is asserted, and therefore at t918, neg-max (446) value is added to the current accumulated value in accumulator-negative 450. Thus, acc-neg-q (452) is shown to be having value '−1' in time interval t918-t924. At t924, value 'max2' is added to acc-neg-q (452), resulting in a value of 'max2−1' in accumulator-negative 450.

It may be observed that both accumulator-positive (440) and accumulator-negative (450) accumulate large values, exceeding respective thresholds (i.e., 'max1' for accumulator-positive, 440 and 'max2' for accumulator-negative, 450). This occurs when a sufficient number of both positive and negative values exist in running-count-diff (433). In the absence of jitter, only one of the accumulators (accumulator-positive (440) or accumulator-negative (450) but not both) accumulates threshold values. For example, in the illustration of FIG. 8A (with clk-in-2 (101-2) lagging clk-in-1 (101-1) in phase), only accumulator-positive (440) accumulates threshold value. In the illustration of FIG. 8B (with clk-in-2 (101-2) leading clk-in-1 (101-1) in phase), only accumulator-negative (450) accumulates threshold value.

When both accumulator-positive (440) and accumulator-negative (450) accumulate large values, it is indicative of presence of jitter either one of input clock signals, which otherwise have zero phase difference.

In time interval t918-t924, jitter-detector 460 checks if values of both acc-pos-q (442) and acc-neg-q (452) have exceeded respective thresholds. While acc-pos-q (442) has exceeded the threshold value, acc-neg-q (452) has not exceeded the threshold value. Therefore, jitter-detector (460) does not generate a logic HIGH on path 392 (jitter-present).

At t924, jitter-detector 460 checks if values of both acc-pos-q (442) and acc-neg-q (452) have exceeded respective thresholds. Jitter-detector 460 determines that both accumulators have exceeded respective thresholds. Therefore, jitter-detector 460 generates a logic HIGH on path 392 (jitter-present). As noted above, jitter-detector 460 de-asserts jitter-present (392) after one clock cycle of clk-dig-tdc (307). Also, at t924, jitter-detector 460 generates a logic HIGH on path 393 (use-jitter-approach). Jitter-detector 460 keeps signal use-jitter-approach asserted (logic HIGH) till the end of accumulation of pre-determined number of phase difference samples (indicated by assertion of nsample-done on path 447), after which jitter-detector 460 de-asserts signal use-jitter-approach (393).

At t926, as a result of receiving a logic HIGH on path 392 (jitter-present), accumulator-positive (440) and accumulator-negative (450) clear (set to a boundary value, e.g., zero) the respective accumulated values (acc-pos-q, 442 and acc-neg-q, 452). Accordingly, acc-pos-q (442) and acc-neg-q (452) are shown as having have zero values, starting at t926. Similarly, pos-min-generator (435) and neg-max-generator (445) also clear (set to a boundary value, e.g., zero) the respective values upon receiving a logic HIGH on path 392 (jitter-present), and are accordingly shown to be having zero values, starting at t926. Also, at t926, nsample-counter (444) resets the sample counter to zero, thus ending the current accumulation cycle and starting a new accumulation cycle (of pre-determined number of windows).

In an embodiment, only accumulator-positive (440) is restarted, and accumulator-negative (450) is not used in the presence of jitter. FIG. 9B is a timing diagram (not to scale) illustrating the manner in which TDC 100 operates to provide phase differences in the presence of jitter, in an embodiment of the present disclosure. The timing diagram of FIG. 9B illustrates the operation of TDC subsequent to the time instant t930 of FIG. 9A.

Accordingly, example waveforms of FIG. 9B, namely clk-dig-tdc (307), clk-in-1 (101-1), count-1 (104-1), count1-q (406-1), unique-count1 (501-1), unique-count1-q (411-1), clk-in-2 (101-2), count-2 (104-2), count2-q (406-2), unique-count2 (501-2), unique-count2-q (411-2), window-identifier (332), running-count-diff (433), pos-min (436), neg-max (446), acc-pos-q (442) and acc-neg-q (452), correspond to those shown in FIG. 9A and their description is not repeated here in the interest of brevity.

As noted above with respect to FIG. 9A, prior to t940, jitter has been identified to be present and accumulator-positive (440) and accumulator-negative (450) have been reset to a boundary value (e.g., zero in the illustrative embodiment).

Starting at t940, accumulator-positive (440) accumulates phase difference values as described below while accumulator-negative (450) does not accumulate any values. Clk-in-2 (101-2) is shown to be continuing to have jitter. Since signal use-jitter-approach (393) (not shown) is a logic HIGH (starting at t924 in FIG. 9A), accumulator-positive (440) computes a lower magnitude (absolute minimum) of pos-min (436) and neg-max (446) received in each window, and accumulates (adds) the computed value with the corresponding sign to the current value of accumulator-positive 440.

Accordingly, at t948, accumulator-positive 440 computes the lower minimum of values 'max1' and '−1', and adds '−1' to acc-pos-q (442) (which is zero in this case). Similarly, at t954, accumulator-positive 440 computes the lower minimum of values '1' and 'max2', and adds '+1' to acc-pos-q (442) (which is '−1' in this case), resulting in '0'. Using similar operations, acc-pos-q (442) is shown to be having value '−1' in time interval t948-t954, '0' in time interval t954-t960 and '−1' in time interval t960-966.

Thus, the accumulated phase difference is substantially equal to zero or a very small value. The accumulated value divided by the number of samples accumulated (which is equal to the number of windows, e.g., 1024) is provided as the phase difference between the input clocks.

It may be appreciated that for a given magnitude (jitter-input) of jitter, more the number of samples accumulated (i.e., longer the averaging), greater is the accuracy with which the phase difference can be estimated. After averaging, the jitter in the input clocks may be reduced by jitter-input/sqrt(nsample).

Although the illustrative embodiment depicted in FIGS. 9A and 9B are described with respect to the input clocks having the same frequency, aspects of the present disclosure are applicable to input clocks which have frequencies that are integer-related multiples greater than one.

Further, though accumulator-positive 440, running-accumulator-data-generator 465 and accumulator-valid-data-generator 475 are shown to be operating using alternate logic in the presence of jitter, in alternative embodiments, such logic may be implemented in a separate block with appropriate changes to signal paths. Furthermore, in alternative embodiments, the output of accumulator-positive 440 may be provided as an accumulated phase difference on a separate path when jitter is present.

According to another aspect of the present disclosure, TDC 100 accumulates a pre-determined (provided by user) number of phase differences between input clocks (clk-in-1, 101-1 and clk-in-2, 101-2) and averages the accumulated value (i.e., accumulated value divided by the number of phase difference samples) in order to potentially improve resolution with which the phase difference can be determined. The manner in which such accumulation is implemented is described next with an example.

14. Accumulation of Phase Difference Samples

Figure 10:
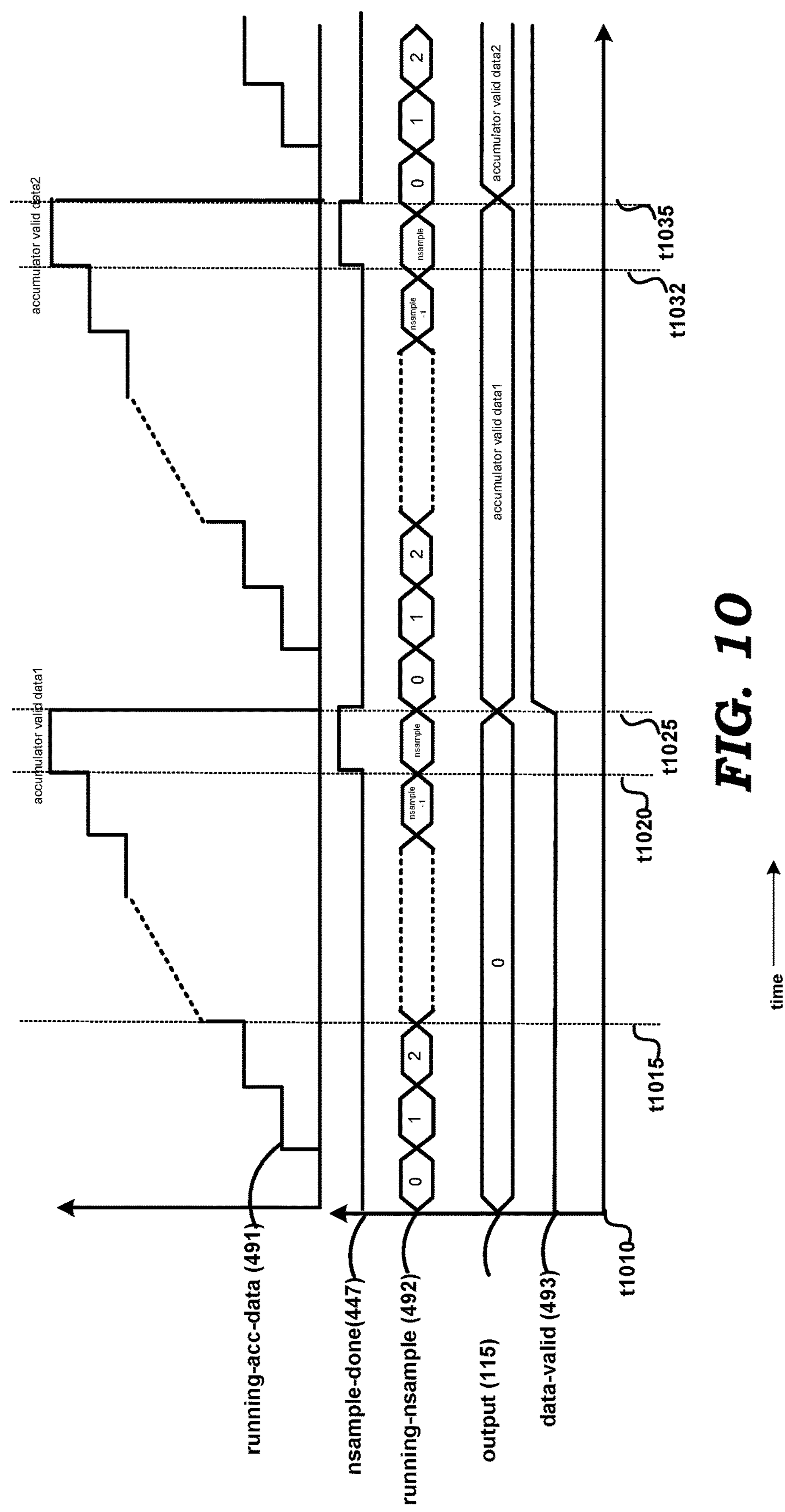
FIG. 10 is a timing diagram illustrating the manner in which phase difference samples are accumulated, in an embodiment of the present disclosure.

FIG. 10 is a timing diagram (not to scale) illustrating accumulation of phase difference samples in an embodiment of the present disclosure. Specifically, the figure is shown containing waveforms running-acc-data (491), nsample-done (447), running-nsample (492), output (115) and data-valid (493). Waveforms 115, 493, 491 and 493 are available in modes (1) and (2) (noted above) of TDC 100.

As noted earlier with respect to FIG. 3B, running-accumulator-data-generator 465 generates running-acc-data (491) and running-nsample (492). Running-acc-data (491) represents the accumulated phase difference value upon the end of each window.

Running-acc-data (491) is desirable in situations where input clocks (clk-in-1, 101-1 and clk-in-2, 101-2) have small frequencies (such as ~1 Hertz) and the user has programmed a relatively high number (say, 1024) of pre-determined number of phase difference samples to be accumulated. Each accumulation cycle would accordingly be of a duration of 1024 seconds. In such cases, the user is required to wait for 1024 seconds (after start of an accumulation cycle) before accumulated data is available on output path 115. Meanwhile, if the user desires to check an intermediate accumulated value (say at around 3 seconds or 10 seconds after start of the accumulation cycle), the user can do so by reading accumulated data available on path 491 (running-acc-data) upon the end of any desired number of windows.

Referring to FIG. 10, two accumulation cycles are shown, one between time interval t1010-t1025 and the next one between t1025-t1035). Accordingly, nsample-done (447) is asserted at time instants t1020 and t1032.

Accumulated data is available on path 115 by time instant t1025 (at the end of first accumulation cycle in duration t1010-t1025), and is held at that value (accumulator valid data1) until the next accumulation cycle is complete (in this case, until t1035). At t1025, data-valid (493) is also asserted to indicate that data available on path 115 is valid. If the user reads output on path 115 during time interval t1025-t1035, the user is provided with value (accumulator valid datal) updated at t1025.

In mode (1), referring to FIG. 8A, when accumulation cycle ends at t830 (based on pre-determined number of phase difference samples, provided as user input), accumulator-valid-data-generator 375 determines the absolute minimum of acc-pos-q (342) and acc-neg-q (352), and provides the value on path 115 (output). Thus, the value of '21' is provided as output (115), starting at t830 until the end of the next accumulation cycle.

In mode (2), referring to FIG. 8B, prior to t857, acc-pos-q (342) is shown as having a value of 655 as a result of previous accumulation (not shown). At t855, window-identifier (232) is asserted, and therefore at t857, pos-min (336) value is added to the current accumulated value. Thus, starting at t857, acc-pos-q (342) is shown to be having the value (655+17), i.e., 672. At t878, after window-identifier (232) is asserted at t875, pos-min (336) value is added to the current accumulated value. Thus, starting at t878, acc-pos-q (342) is shown to be having the value (672+16), i.e., 688.

Continuing to refer to FIG. 8B, prior to t857, acc-neg-q (352) is shown as having a large negative value of $(-2^{36-1})$ as a result of previous accumulation (not shown). At t855, window-identifier (232) is asserted, and therefore at t857, neg-max (346) value is added to the current accumulated value. Thus, starting at t857, acc-neg-q (352) is shown to be having the value −68,719,476,734.

Thus, when the accumulation cycle ends at t875 (based on pre-determined number of phase difference samples, provided as user input), accumulator-valid-data-generator 375 determines the absolute minimum of acc-pos-q (342) and acc-neg-q (352), and provides the value on path 115 (output). Thus, the value of 672 is provided as output (115), starting at t878 until the end of the next accumulation cycle.

Running-nsample (492) value is incremented every time window-identifier (232) (not shown) is asserted. Each value of data running-acc-data (491) is also updated every time window-identifier (232) is asserted (upon the end of each window). Thus, if the user desires to check the accumulated value between the start and end of an accumulation cycle, the user may read running-acc-data on path 491. Running-nsample data available on path 492 indicates the number of accumulated samples available on path 491.

For example, referring now to FIG. 10, if the user reads running-acc-data (491) at time instant t1015, running-nsample (492) indicates that 2 samples have been accumulated and the absolute minimum value of acc-pos-q (342) and acc-neg-q (352) is available on path 491 (running-acc-data).

In mode (1), referring to FIG. 8A, accumulator-positive 340 and accumulator-negative 350 respectively accumulate pos-min (336) and neg-max (346) values, as depicted in FIG. 8A. For running accumulator data provided as output on path 491, absolute minimum of instantaneous values of acc-pos-q (342) and acc-neg-q (352) would be determined. Thus, running-acc-data (491) provides a value of '21' in time duration t818-t826, and a value of '42' in time duration t826-t832. In mode (2), referring to FIG. 8B, running-acc-data (491) provides a value of 655 in time duration t857-t878, and a value of 672, starting at t878. Thus, TDC 100 provides accumulated data in accumulator modes (1) and (2).

In this manner, aspects of the present disclosure enable a TDC to operate with peripdic inputs with jitter. TDC 100 implemented as described above can be incorporated in a larger device or system as described briefly next.

15. System

Figure 11:
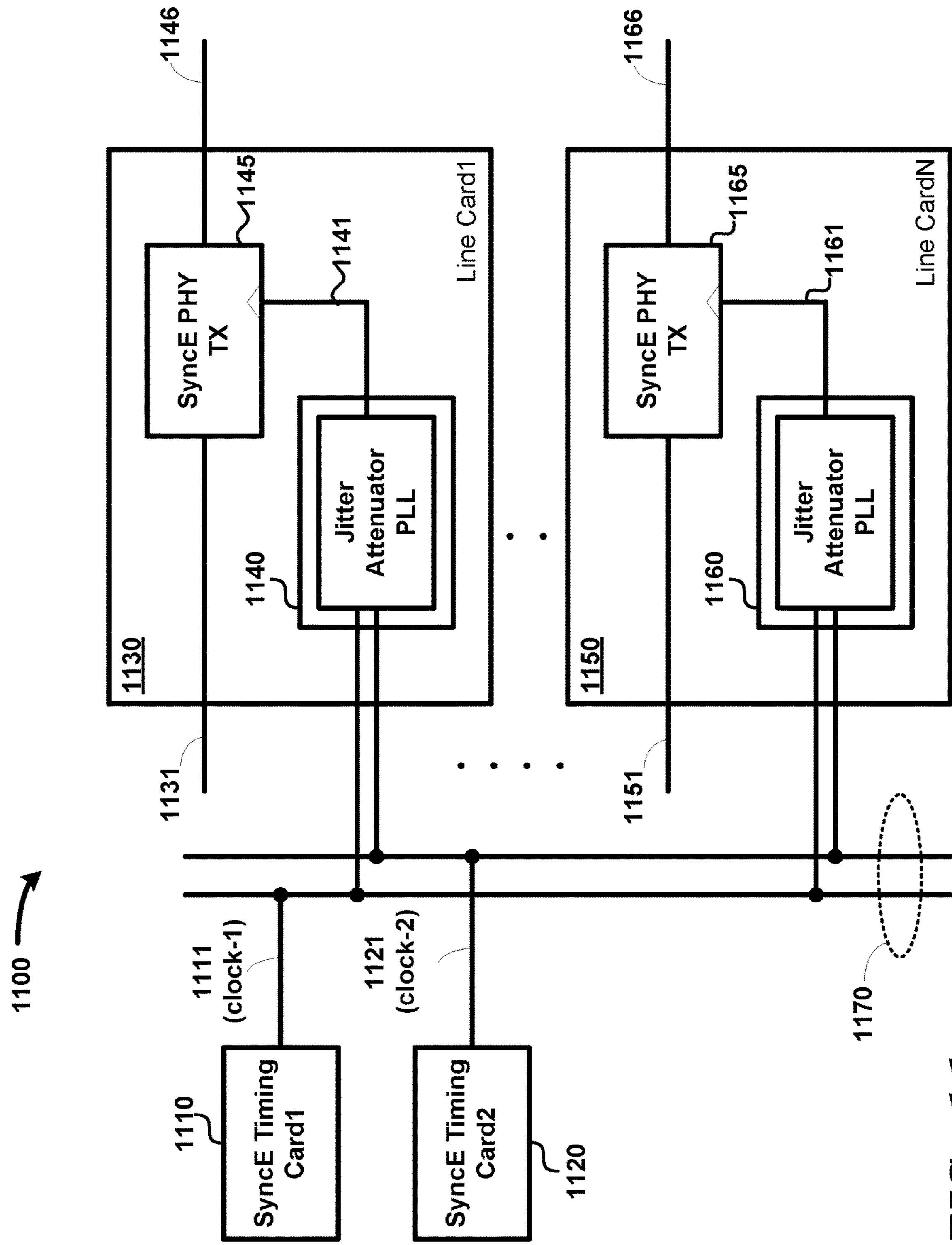
FIG. 11 is a block diagram of a system in which a device implemented according to several aspects of the present disclosure can be incorporated, in an embodiment of the present disclosure.

FIG. 11 is a block diagram of an example system containing a PLL implemented according to various aspects of the present disclosure, as described in detail above. System 1100 is shown containing SyncE (Synchronous Ethernet) timing cards (1110 and 1120) and line cards 1 through N, of which only two line cards 1130 and 1150 are shown for simplicity. Line card 1130 is shown containing jitter attenuator PLL 1140 and SyncE PHY Transmitter 1145. Line card 1150 is shown containing jitter attenuator PLL 1160 and SyncE PHY Transmitter 1165. The components of FIG. 11 may operate consistent with the Synchronous Ethernet (SyncE) network standard. As is well known in the relevant arts, SyncE is a physical layer (PHY)-based technology for achieving synchronization in packet-based Ethernet networks. The SyncE clock signal transmitted over the physical layer should be traceable to an external master clock (for example, from a timing card such as card 1110 or 1120). Accordingly, Ethernet packets are re-timed with respect to the master clock, and then transmitted in the physical layer. Thus, data packets (e.g., on path 1131 and 1132) are re-timed and transmitted without any time stamp information being recorded in the data packet. The packets may be generated by corresponding applications such as IPTV (Internet Protocol Television), VoIP (Voice over Internet Protocol), etc.

Thus, line card 1130 receives a packet on path 1131, and forwards the packet on output 1146 after the packet has been re-timed (synchronized) with a master clock. Similarly, line card 1150 receives a packet on path 1151, and forwards the packet on output 1166 after the packet has been re-timed (synchronized) with a master clock.

The master clock (1111/clock 1) is generated by timing card 1110. Timing card 1120 generates a redundant clock (1121/clock-2) that is to be used by line cards 1130 and 1150 upon failure of master clock 1111. Master clock 1111 and redundant clock 1121 are provided via a backplane (represented by numeral 1170) to each of lines cards 1130 and 1150.

In line card 1130, jitter attenuator PLL 1140 may contain TDC 100 for detecting phase difference between it input cocks, described above in detail, and receives clocks 1111 and 1121. PLL 1140 generates an output clock 1141 which is used to synchronize (re-time) packets received on path 1131 and forwarded as re-timed packets on path 1146.

Similarly, in line card 1150, jitter attenuator PLL 1160 may also contain TDC 100 for detecting phase difference between it input cocks, described above in detail, and receives clocks 1111 and 1121. PLL 1160 generates an output clock 1161 which is used to synchronize (re-time) packets received on path 1151 and forwarded as re-timed packets on path 1166. Upon being out of phase-lock, PLL 1160 is designed to provide locking of phase in the manner described above in detail.

16. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1A, 1B, 2A, 3A, 3B and 4, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, the NMOS transistors may be replaced with PMOS (P-type MOS) transistors, while also interchanging the connections to power and ground terminals.

Accordingly, in the instant application, the power and ground terminals are referred to as constant reference potentials, the source (emitter) and drain (collector) terminals of transistors (though which a current path is provided when turned on and an open path is provided when turned off) are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A time-to-digital converter (TDC), said TDC comprising:

a count logic to generate a first sequence of counts and a second sequence of counts respectively for a first periodic signal and a second periodic signal received as input signals, said first sequence of counts representing respective time instances on a time scale at which a first sequence of edges with a first direction of said first periodic signal occur, said second sequence of counts representing respective time instances on said time scale at which a second sequence of edges with said first direction of said second periodic signal occur; and a core logic to identify whether jitter is present in either one of said first periodic signal and said second periodic signal by processing said first sequence of counts and said second sequence of counts.

2. The TDC of claim 1, wherein said core logic operates to generate a sequence of phase differences between said first periodic signal and said second periodic signal according to a first approach if jitter is not present, and according to a second approach if jitter is present.

3. The TDC of claim 2, wherein said second periodic signal has a frequency that is an integer multiple of frequency of said first periodic signal, wherein said core logic further operates to:

generate a sequence of window boundaries identifying respective time instances by which edges of said direction have occurred in both of said first periodic signal and said second periodic signal, wherein a time duration between two successive boundaries constitutes a corresponding window of a sequence of windows;

subtract a respective first count of said first sequence of counts from a respective sub-sequence of counts of said second sequence of counts in each window to generate a sequence of time differences in each window, wherein each time difference has a corresponding sign and a magnitude, wherein said first approach comprises computing each phase difference of said sequence of phase differences by aggregating positive time differences and negative time differences in separate accumulators, wherein said second approach comprises computing each phase difference of said sequence of phase differences by aggregating both of said positive time differences and said negative time differences into a single accumulator.

4. The TDC of claim 3, wherein said TDC is operable when said integer multiple is one and also when said integer multiple is greater than 1.

5. The TDC of claim 4, wherein said core logic comprises:

an input analyzer block to generate said sequence of window boundaries from said first sequence of counts and said second sequence of counts; and an output generator to generate one value of a sequence of values in each window of said sequence of windows, wherein the value indicates the corresponding phase difference for the window.

6. The TDC of claim 5, wherein said output generator comprises:

a subtraction unit to generate said sequence of time differences for each window;

a positive-minimum-generator to select a positive-minimum value representing the least value of positive values comprised in said sequence of time differences;

a negative-maximum-generator to select a negative-maximum value representing the maximum value of negative values comprised in said sequence of time differences;

a first accumulator to receive a sequence of said positive-minimum values covering corresponding windows, and to add values in said sequence of said positive-minimum values to generate a first accumulated value;

a second accumulator to receive a sequence of said negative-minimum values covering said corresponding windows, and to add values in said sequence of said negative-minimum values to generate a second accumulated value; and a jitter-detector-block to receive said first accumulated value and said second accumulated value, and to generate a jitter-present signal indicating whether or not said jitter is present, wherein said jitter-detector-block determines that said jitter is present if both of said first accumulator and said second accumulator have exceeded respective thresholds.

7. The TDC of claim 6, wherein said output generator comprises:

a first accumulator output block to receive said first accumulated value and said second accumulated value, and to generate a minimum of magnitudes of said first accumulated value and said second accumulated value as an accumulated phase difference up to said corresponding window when jitter is determined not to be present.

8. The TDC of claim 7, wherein when said jitter is determined to be present, one of said first accumulator and said second accumulator is reset to a boundary value, wherein said resetted accumulator thereafter accumulates one of said positive-minimum value and said negative-maximum value having lower magnitude in each window, wherein said first accumulator output block forwards the accumulated value in said resetted accumulator as said accumulated phase difference.

9. The TDC of claim 8, wherein said output generator further comprises:

a window counter to count up to a pre-determined number of said windows, wherein said first accumulator and said second accumulator are reset upon said window counter counting up to said pre-determined number of said windows and also when said jitter detector block detects that jitter is present, when jitter is determined to be present, said resetted accumulator is operative to accumulate for said pre-determined number of said windows before subsequent time differences are again examined for jitter.

10. The TDC of claim 9, further comprising a second accumulator output block to determine a lower magnitude of said first accumulated value and said second accumulated value received upon the end of said pre-determined number of windows, and to provide said lower magnitude value as accumulated phase difference when jitter is not present, said second accumulator output block to forward output of said resetted accumulator spanning said pre-determined number of windows as said accumulated phase difference, when jitter is present.

11. A method of processing periodic signals in a Time-to-Digital Converter (TDC), said method comprising:

receiving a first sequence of counts and a second sequence of counts respectively for a first periodic signal and a second periodic signal, said first sequence of counts representing respective time instances on a time scale at which a first sequence of edges with a first direction of said first periodic signal occur, said second sequence of counts representing respective time instances on said time scale at which a second sequence of edges with said first direction of said second periodic signal occur; and examining said first sequence of counts and said second sequence of counts to identify existence of jitter in either one of said first periodic signal and second periodic signal.

12. The method of claim 11, when said first periodic signal has the same frequency as said second periodic signal, said examining comprises:

subtracting each count of said first sequence of counts from a corresponding count of said second sequence of counts to form a sequence of differences; and checking whether there exist a sufficient number of both positive values and negative values in said sequences of differences to indicate of presence of jitter in one of said two periodic signals.

13. The method of claim 12, when said second periodic signal has a frequency that is an integer multiple of frequency of said first periodic signal, said examining comprises:

generate a sequence of window boundaries identifying respective time instances by which edges of said direction have occurred in both of said first periodic signal and said second periodic signal, wherein a time duration between two successive boundaries constitutes a corresponding window of a sequence of windows;

subtract a respective first count of said first sequence of counts from a respective sub-sequence of counts of said second sequence of counts in each window to generate a sequence of differences in each window;

identify a minimum value of positive values and a maximum value of negative values in said sequence of differences;

accumulating said minimum value for a sequence of windows as a first accumulated value and said maximum value for said sequence of windows as a second accumulated value, selecting a smaller magnitude of said first accumulated value and said second accumulated value as an accumulated phase difference up to the corresponding window when jitter is not present.

14. The method of claim 13, wherein said checking checks whether both of said first accumulated value and said second accumulated value have exceeded respective thresholds to conclude presence of jitter.

15. The method of claim 14, when jitter is present, further comprising:

resetting one of said first accumulator and said second accumulator to a boundary value, continuing said resetted accumulator thereafter accumulates one of said positive minimum value and said negative maximum value having lower magnitude in each window, wherein said resetted accumulator forwards the accumulated value as said accumulated phase difference.

16. A system comprising:

a TDC to generate a sequence of outputs representing the phase differences at respective time instances between a first periodic signal and a second periodic signal received as input signals, wherein said TDC is operable to identify whether jitter is present in either one of said first periodic signal and said second periodic signal, and perform a corrective action to mitigate impact of jitter in measurement of the phase differences; and a processing block to process said sequence of outputs.

17. The system of claim 16, further comprising a phase locked loop containing said TDC and said processing block operates to minimize any phase differences between said first periodic signal and said second periodic signal represented by said sequence of outputs.

18. The system of claim 16, wherein said TDC comprises:

a count logic to generate a first sequence of counts and a second sequence of counts respectively for said first periodic signal and said second periodic signal, said first sequence of counts representing respective time instances on a time scale at which a first sequence of edges with a first direction of said first periodic signal occur, said second sequence of counts representing respective time instances on said time scale at which a second sequence of edges with said first direction of said second periodic signal occur; and a core logic to identify whether jitter is present in either one of said first periodic signal and said second periodic signal by processing said first sequence of counts and said second sequence of counts, wherein said core logic operates to generate said sequence of outputs between said first periodic signal and said second periodic signal according to a first approach if jitter is not present, and according to a second approach if jitter is present.

19. The system of claim 18, wherein said second periodic signal has a frequency that is an integer multiple of frequency of said first periodic signal, wherein said core logic further operates to:

generate a sequence of window boundaries identifying respective time instances by which edges of said direction have occurred in both of said first periodic signal and said second periodic signal, wherein a time duration between two successive boundaries constitutes a corresponding window of a sequence of windows;

subtract a respective first count of said first sequence of counts from a respective sub-sequence of counts of said second sequence of counts in each window to generate a sequence of time differences in each window, wherein each time difference has a corresponding sign and a magnitude, wherein said first approach comprises computing each output of said sequence of outputs by aggregating positive time differences and negative time differences in separate accumulators, wherein said second approach comprises computing each output of said sequence of outputs by aggregating both of said positive time differences and said negative time differences into a single accumulator.

20. The system of claim 19, wherein said TDC is operable when said integer multiple is one and also when said integer multiple is greater than 1.

* * * * *